(12) United States Patent
Matsumoto

(10) Patent No.: US 9,467,088 B2
(45) Date of Patent: Oct. 11, 2016

(54) POWER GENERATION DEVICE, THERMAL POWER GENERATION METHOD AND SOLAR POWER GENERATION METHOD

(75) Inventor: Takahiro Matsumoto, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 356 days.

(21) Appl. No.: 13/882,409

(22) PCT Filed: Aug. 29, 2011

(86) PCT No.: PCT/JP2011/069476
§ 371 (c)(1),
(2), (4) Date: Apr. 29, 2013

(87) PCT Pub. No.: WO2012/056806
PCT Pub. Date: May 3, 2012

(65) Prior Publication Data
US 2013/0213460 A1    Aug. 22, 2013

(30) Foreign Application Priority Data

Oct. 29, 2010   (JP) .................... 2010-244056

(51) Int. Cl.
*H01L 31/04*   (2014.01)
*H02S 10/30*   (2014.01)
*H01L 31/0236*   (2006.01)
*H01L 35/00*   (2006.01)
*H01L 31/054*   (2014.01)

(52) U.S. Cl.
CPC ........... *H02S 10/30* (2014.12); *H01L 31/0236* (2013.01); *H01L 31/0543* (2014.12); *H01L 31/0547* (2014.12); *H01L 35/00* (2013.01); *Y02E 10/52* (2013.01)

(58) Field of Classification Search
CPC ............... H01L 31/00; H01L 31/0525; H01L 31/0406; H01L 31/0547; H01L 31/0543; H02S 10/30
See application file for complete search history.

(56) References Cited

U.S. PATENT DOCUMENTS 5,336,341 A    8/1994   Maejima et al.
5,601,661 A *  2/1997   Milstein et al. ............. 136/253
(Continued)

FOREIGN PATENT DOCUMENTS

JP    4-110493 A    4/1992
JP    8-111546 A    4/1996
(Continued)

OTHER PUBLICATIONS

A. Wang et al.; "24% efficient silicon solar cells"; Appl. Phys. Lett. 57(6); Aug. 6, 1990; pp. 602-604.
(Continued)

*Primary Examiner* — Allison Bourke
*Assistant Examiner* — Edward Schmiedel
(74) *Attorney, Agent, or Firm* — Kenealy Vaidya LLP

(57) ABSTRACT

A small sized power generator is provided, being highly efficient in power generation. The power generator can include a heat-light conversion element for converting heat to infrared light and a semiconductor power generation cell for converting the infrared light to electrical energy. The heat-light conversion element can include a material in which reflectance is higher on a long wavelength side of a predetermined infrared wavelength, relative to reflectance on a short wavelength side thereof. The material can cause radiation of the infrared light upon being heated. Heat from a heat source is transferred to the heat-light conversion element, thereby radiating the infrared light. The semiconductor power generation cell converts this infrared light to electrical energy, thereby performing thermal power generation. In order to heat the heat-light conversion element, a light collection optical system can be provided for collecting sunlight toward the heat-light conversion element, enabling solar thermo-photovoltaic power generation.

3 Claims, 27 Drawing Sheets

(56) References Cited

U.S. PATENT DOCUMENTS

| | | | |
|---|---|---|---|
| 2003/0214258 A1* | 11/2003 | R. McIntosh | 315/291 |
| 2004/0244830 A1 | 12/2004 | Hokoi et al. | |
| 2011/0052871 A1* | 3/2011 | Matsumoto | C09K 5/14 428/141 |
| 2011/0094572 A1* | 4/2011 | Janson | 136/253 |

FOREIGN PATENT DOCUMENTS

| | | |
|---|---|---|
| JP | 10-126050 A | 5/1998 |
| JP | 11-317547 A | 11/1999 |
| JP | 2001-196622 A | 7/2001 |
| JP | 2003-332607 A | 11/2003 |
| JP | 2004-363248 A | 12/2004 |
| JP | 2005-260089 A | 9/2005 |
| JP | 2007-81341 A | 3/2007 |
| WO | 2009/104347 A1 | 8/2009 |

OTHER PUBLICATIONS

M. Yamaguchi et al.; "Super high-efficiency multi-junction and concentrator solar cells"; Elsevier; ScienceDirect; Solar Energy Materials & Solar Cells; 90 (2006); pp. 3068-3077.

K. Araki et al.; "Achievement of 27% efficient and 200wp concentrator module and the technological roadmap toward realization of more than 31% efficient modules"; Elsevier; ScienceDirect; Solar Energy Materials & Solar Cells; 90 (2006); pp. 3312-3319.

V.D. Rumyantsev et al.; "Structural Features of a Solar TPV Systems"; Sixth Conference on Thermophotovoltaic Generation of Electricity; vol. 738, 2004; pp. 79-87.

H. Yugami et al.; "Solar Thermophotovoltaic Using Al2O3/Er3 Al5O12 Eutectic Composite Selective Emitter"; Photovoltaic Specialists Conference, 2000; Conference Record of the Twenty-Eighth IEEE; 2000; pp. 1214-1217.

C.E. Kennedy; "Review of Mid-to High-Temperature Solar Selective Absorber Materials"; NREL/TP-520-31267; 2002.

J.I. Gittleman et al.; "Optical Properties and Selective Solar Absorption of Composite Material Films"; Thin Solid Films; vol. 45, 1977; pp. 9-18.

Qi-Chu Zhang et al.; "New Cermet film structures with much Improved selectivity for solar thermal applications"; Applied Physics Letters; vol. 60, 1992; pp. 545-547.

N.P. Sergeant et al.; "High performance solar-selective absorbers using coated sub-wavelength gratings"; Optics Express; vol. 18, Mar. 3, 2010; pp. 5525-5540.

International Search Report for PCT/JP2011/069476 dated Oct. 4, 2011.

* cited by examiner

POWER GENERATION DEVICE, THERMAL POWER GENERATION METHOD AND SOLAR POWER GENERATION METHOD

This application is a U.S. national phase filing under 35 U.S.C. §371 of PCT Application No. PCT/JP2011/069476, filed Aug. 29, 2011, and claims priority under 35 U.S.C. §119 to Japanese patent application no. 2010-244056, filed Oct. 29, 2010, the entireties of both of which are incorporated by reference herein.

TECHNICAL FIELD

The presently disclosed subject matter relates to a system for generating electric power by using energy of a heat source or sunlight, and in particular, it relates to a power generator being small in size with high conversion efficiency.

BACKGROUND ART

Thermoelectric conversion elements for converting thermal energy to electrical energy are disclosed in the Patent documents 1 to 3. Those thermoelectric conversion elements are configured such that a p-type semiconductor material is joined with an n-type semiconductor material via metal or the like, and when the joint part is heated, power is generated according to the Seebeck effect. Bi—Te based materials are used as the p-type semiconductor material and the n-type semiconductor material.

On the other hand, as a system for converting energy from sunlight to electrical energy, there is disclosed a solar battery that utilizes a silicon semiconductor and a compound semiconductor, as described in the Non Patent Documents 1 to 3.

In addition, there is disclosed in the Patent Document 4, a solar heat collecting and power generation technique in which sunlight is converted to heat, and the heat allows water to vaporize, thereby rotating a turbine to generate power. This technique uses a receiver inside of which heat media (sodium nitrite 40%, sodium nitrate 7%, and potassium nitrate 53%) are arranged for collecting heat from sunlight, a heliostat for tracking sunlight to collect light, and the like.

PRIOR ART DOCUMENT

Patent Document

Patent Document 1
Japanese Unexamined Patent Application Publication No. 8-111546
Patent Document 2
Japanese Unexamined Patent Application Publication No. 11-317547
Patent Document 3
Japanese Unexamined Patent Application Publication No. 2005-260089
Patent Document 4
International Publication WO 2009/104347

Non Patent Document

Non Patent Document 1
A. Wang, et al., Appl. Phys. Lett. 57, 602 (1990)
Non Patent Document 2
M. Yamaguchi et al., Solar Energy Materials & Solar Cells 90, 3068 (2006)
Non Patent Document 3
K. Araki et al., Solar Energy Materials & Solar Cells 90, 3312 (2006)

DISCLOSURE

Since the thermoelectric conversion elements described in the Patent Documents 1 to 3 include a semiconductor material whose performance is not high, it is only possible to obtain efficiency in the range from a few percent to 10% or so, upon converting heat to electricity. In addition, since metals such as Bi and Te are very expensive and toxic heavy metals, cost of the thermoelectric conversion element increases, as well as causing heavy environmental loading.

Meanwhile, as described in the Non Patent Documents 1 to 3, the solar battery using a silicon semiconductor has power generation efficiency of 20%, and the solar battery using a compound semiconductor has the power generation efficiency of 30%. Therefore, they are not sufficiently efficient yet. The latter case is liable to increase production cost, because many dissimilar kinds of compound semiconductor films with different band gaps are stacked in order to absorb a wide-band solar spectrum efficiently.

The solar heat collecting and power generation system as described in the Patent Document 4 has a large-scale device configuration. The power generation efficiency is less than 30%, and thus power generation cost is high.

According to one aspect of the presently disclosed subject matter, a power generator can be small in size with high power generation efficiency.

A power generator as described below can be provided according to a first aspect of the presently disclosed subject matter. A power generator can comprise a heat-light conversion element for converting heat to infrared light, and a semiconductor power generation cell for converting the infrared light to electrical energy. The heat-light conversion element can include a material in which a reflectance is higher on a long wavelength side of a predetermined infrared wavelength, relative to the reflectance on a short wavelength side thereof. The material causes the characteristic infrared radiation upon heated.

It is further possible to perform solar thermo-photovoltaic power generation with a configuration that a sun-light concentrating system is provided to collect sunlight toward the heat-light conversion element, in order to heat the heat-light conversion element.

According to the presently disclosed subject matter, heat is converted into infrared light having a predetermined wavelength, and the infrared light is further converted into electrical energy by the semiconductor power generation element, and therefore, it is possible to reduce a loss due to the Stokes shift between solar spectrum and the band gap of the semiconductor power generation element. This allows power generation with a high degree of efficiency.

Figure 1:
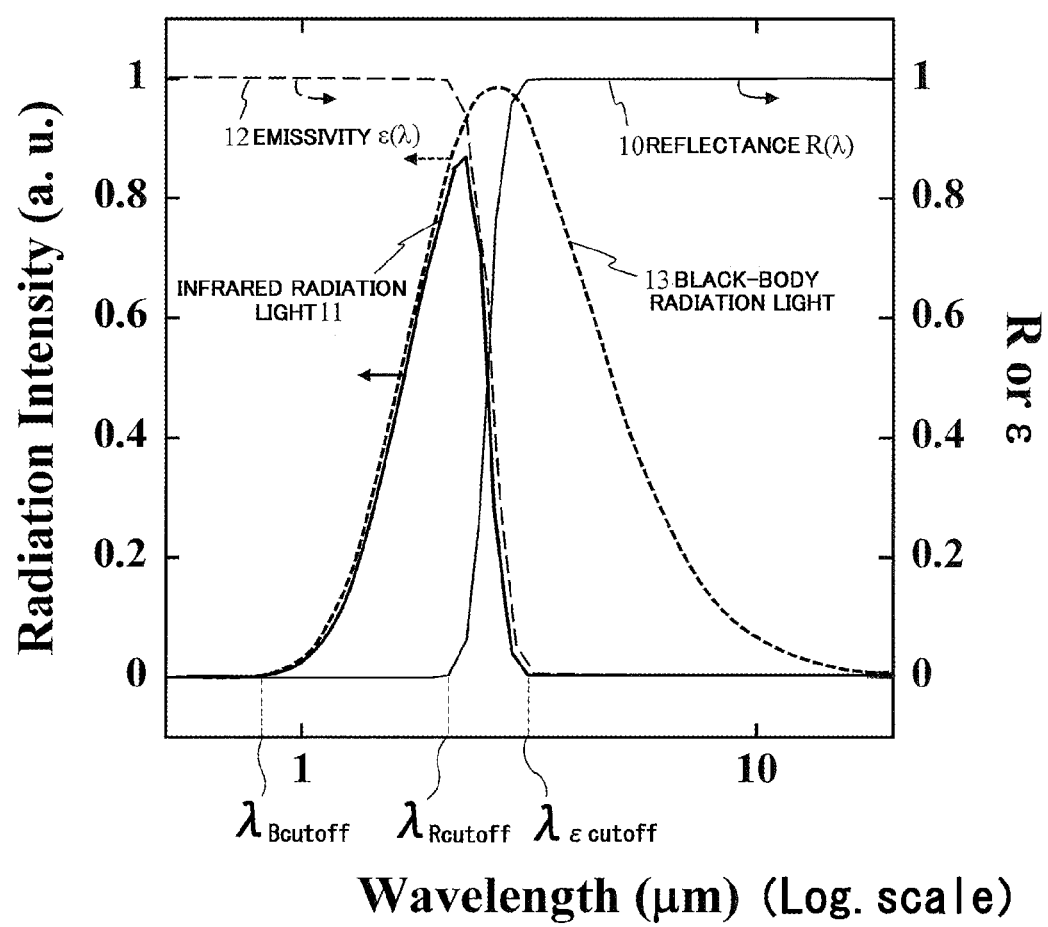
FIG. 1 is a graph showing the principle of infrared radiation from a material having a predetermined reflectance property according to the presently disclosed subject matter.

An explanation will be made as to the power generator which represents one embodiment of the presently disclosed subject matter.

A material whose reflectance on a long wavelength side of a predetermined infrared wavelength is higher than the reflectance on a short wavelength side thereof, radiates infrared light with the spectrum shorter than the predetermined infrared wavelength when the material is heated, and the presently disclosed subject matter employs this material (hereinafter, referred to as "infrared radiation material") as a heat-light conversion element. The infrared radiation material is heated, and the heat is converted to infrared light. The infrared light being converted is further converted to electrical energy by a semiconductor power generation cell having the band gap in the infrared region.

The spectrum of the infrared light radiated from the infrared radiation material situates on the shorter wavelength region of a cutoff wavelength. This is due to the fact that the infrared radiation material has the step-function-like emissivity (=1−(reflectance)) imposed on the surface of the infrared radiation material. (It is to be noted here that the meaning of the step-function-like emissivity indicates that the emissivity is drastically reduced to be 0 at the longer wavelength region of the cutoff wavelength. The cutoff wavelength may be obtained by extrapolating a sloping curve of the emissivity.) The thermal radiation spectrum from the infrared radiation material becomes the product of the blackbody radiation spectrum and the step-function-like emissivity, thus, we can reduce the infrared radiation of the longer wavelength region, whose spectrum band is below the band gap of the semiconductor power generation cell. Therefore, the infrared radiation material is designed in such a manner that the cutoff wavelength is to be situated on the band gap wavelength of the semiconductor power generation cell.

As described above, in the presently disclosed subject matter, it is possible to obtain an infrared radiation spectrum radiated from the infrared radiation material of the heat-light conversion element, completely inhibits the light equal to or longer than the cutoff wavelength side (longer-wavelength infrared light), in comparison to the ideal black body spectrum wavelength at the same temperature. Therefore, when this cutoff wavelength is set to be a value of the same level as the energy gap of the semiconductor power generation cell, this allows the heat to be converted to the infrared light being equal to or more than the energy gap, with approximately 100% efficiency, and then absorbed into the semiconductor power generation cell. Accordingly, as compared with the case where the infrared light according to the black-body radiation is absorbed into the semiconductor power generation cell and converted to electrical energy, the presently disclosed subject matter allows the semiconductor power generation cell to efficiently absorb the infrared light radiated from the heat-light conversion element, whereby the infrared light can be converted to electrical energy with a high degree of efficiency.

The heat-light conversion element and the semiconductor power generation cell can be disposed in such a manner as being opposed to each other placing space therebetween, and the pressure in the space is reduced to a predetermined degree of vacuum. With this configuration, it is possible to prevent the energy of the heat-light conversion element from being lost by the convective and conductive heat transfer in the air.

Any method is applicable for heating the heat-light conversion element. It is possible to perform thermal power generation by transferring heat to the heat-light conversion element according to thermal conduction and radiation. In addition, the heat-light conversion element is irradiated with sunlight to be heated, thereby performing solar thermo-photovoltaic power generation. By way of example, in the case of the thermal power generation, it is possible to configure such that the heat-light conversion element is fixed on the substrate and heat is conducted to the heat-light conversion element via the substrate. In the case of the solar thermo-photovoltaic power generation, it is configured in such a manner that a light collection optical system is arranged so as to collect sunlight toward the heat-light conversion element.

As the infrared radiation material of the heat-light conversion element, having the aforementioned reflectance property, it is possible to employ a multilayer structure of metal oxide, a cermet film (e.g., a cermet film made of magnesium oxide in which tungsten particles are dispersed), and a graphite compound provided with a structure of asperities on the surface (e.g., the graphite compound provided with a structure of periodic asperities on the order of micrometers, and a structure of periodic asperities on the order of nanometers). It is further possible to configure such that the surface of those infrared radiation materials is deposited with an antireflection coating. By way of example, as the antireflection coating, it is possible to employ a tin (stannic) oxide layer or a film of material with a low refraction index containing $MgF_2$.

Principles of the Presently Disclosed Subject Matter (Solar Thermo-Photovoltaic Power Generator)

Hereinafter, principles of the power generator according to the presently disclosed subject matter will be explained. Firstly, an explanation will be made as to the case where the power generator is a solar thermo-photovoltaic power generator.

In the presently disclosed subject matter, the heat-light conversion element is heated by sunlight, and the heat-light conversion element converts the heat to infrared light with a high degree of efficiency. The infrared light thus converted is further led to a semiconductor power generation cell (photovoltaic cell) and then converted to electrical energy. Accordingly, it is possible to convert sunlight to electrical energy with a high degree of efficiency, by using the semiconductor power generation cell which has a band gap within the infrared light region. In addition, as the heat-light conversion element for converting the sunlight to the infrared light, a material having a predetermined reflectance property (infrared radiation material) is employed. The predetermined reflectance property includes that the reflectance is ideally set to be 1 for the longer wavelength region than a predetermined wavelength and 0 for the shorter wavelength region than a predetermined wavelength. Thus by using this material, it is possible to convert the sunlight to the infrared light whose radiation spectrum is designed to be above the band gap energy of a semiconductor power generation cell, leading to obtain highly efficient thermo-photovoltaic cell.

An explanation will be made as to the principle for converting sunlight to infrared light.

Figure 28:
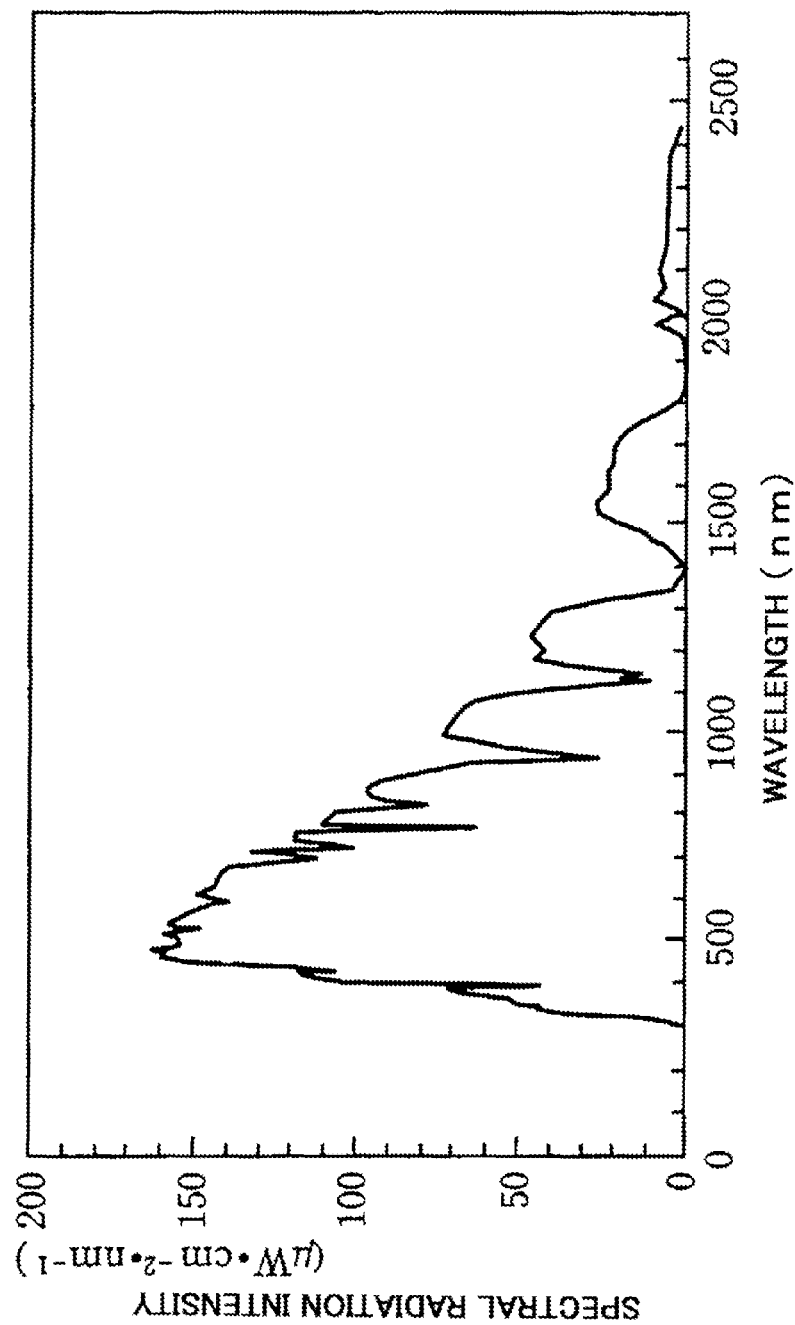
FIG. 28 is a graph showing a spectrum of sunlight.

One example of the reflectance $R(\lambda)$ of the infrared radiation material is represented by the graph 10 being a solid line in FIG. 1. The infrared radiation material of FIG. 1 has the reflectance of approximately 100% as for the wavelength range of 3 μm or longer, and the reflectance of approximately 0% as for the wavelength range of 2 μm or shorter. In other words, the graph 10 represents that the reflectance is drastically reduced as the wavelength becomes shorter around the range from the wavelength 3 μm to 2 μm, and the cutoff wavelength $\lambda_{Rcutoff}$ obtained by extrapolating the sloping curve of the graph is approximately 2 μm. As shown in FIG. 28, since the spectrum of sunlight is located in the wavelength range approximately from 300 nm to 1,500 nm, the cutoff wavelength of the reflectance of the infrared radiation material, which is $\lambda_{Rcutoff}$=approximately 2 μm, is positioned at the longer wavelength side than the edge of the long wavelength side (1,500 nm) of the solar spectrum. Therefore, when the infrared radiation material is irradiated with sunlight, it is possible to absorb approximately 100% of sunlight without reflection. The sunlight energy thus absorbed heats the infrared radiation material.

In the case where the infrared radiation material is placed in vacuum, both the convection- and conduction-heat losses by the air can be reduced. Therefore, the infrared radiation material emits the infrared light with the spectrum 11 as shown in the graph being a bold solid line in FIG. 1 by absorbing the sunlight energy with an approximately 100% efficiency. In other words, the infrared radiation material is heated by sunlight, and the heat is allowed to be converted to infrared light. This principle is based on the Kirchhoff's laws in black-body radiation. Further detailed explanations will be made below.

Following formula (1) gives energy loss in equilibrium state, with respect to input energy of a heated base material under the condition that there is no natural convective heat transfer (e.g., in vacuum).

$$P(\text{total}) = P(\text{conduction}) + P(\text{radiation}) \tag{1}$$

In the formula (1), P(total) represents total input energy, P(conduction) represents energy being dissipated via a contact body of the base material such as a support medium, and P(radiation) represents energy being dissipated by radiation of light on external space at a temperature up to which the base material is heated.

The term of P(radiation) in the formula (1) is able to be expressed by the following formula (2).

$$P(\text{Radiation}) = \int_0^\infty \varepsilon(\lambda) \frac{\alpha \lambda^{-5}}{\exp(\beta/\lambda T) - 1} d\lambda \tag{2}$$

In the formula (2), $\in(\lambda)$ represents emissivity of each wavelength, $\alpha\lambda^{-5}/(\exp(\beta/\lambda T)-1)$ represents the Planck's law of radiation, and $\alpha=3.747\times10^8$ W·μm$^4$/m$^2$, $\beta=1.4387\times10^4$ μmK.

In addition, $\in(\lambda)$ may be represented by the reflectance $R(\lambda)$ in the following formula (3), according to the Kirchhoff's laws.

$$\in(\lambda) = 1 - R(\lambda) \tag{3}$$

According to the formulas (2) and (3), if the material has the reflectance being 1 across the entire wavelength range, ∈(λ) becomes equal to 0 according to the formula (3), and further a value of integral in the formula (2) becomes zero. Therefore, the energy dissipation due to the radiation may not occur any more. This indicates that the formula (1) becomes identical to the following formula (1)'.

$$P(total) = P(conduction) \quad (1)'$$

In other words, this indicates that a small amount of input energy significantly increases the temperature of the base material, since there is no loss of radiation.

On the other hand, as indicated by the graph 12 as shown by a dotted line in FIG. 1, the emissivity ∈(λ) is represented by 1−R(λ) according to the aforementioned formula (3). The emissivity ∈(λ) is approximately 0% in the wavelength range of 3 μm or longer and approximately 100% in the wavelength range of 2 μm or less, then the following formula (4) expresses the dissipation energy of the infrared radiation obtained by heating in vacuum.

$$P\,(\text{Radiation}) = \int_0^\infty \varepsilon_0 \theta(\lambda - \lambda_0) \frac{\alpha \lambda^{-5}}{\exp(\beta/\lambda T) - 1} d\lambda \quad (4)$$

In the formula (4), θ(λ−λ₀) is a function indicating a step function behavior, taking approximately zero in the longer wavelength region and taking approximately 1 in the shorter wavelength region than the predetermined wavelength λ0.

The radiation spectrum being obtained becomes the shape calculated by the convolution of the step function emissivity and the black body spectrum 13 (the bold broken line graph as shown in FIG. 1), and the calculation results becomes the spectrum 11 as shown in FIG. 1. In other words, the radiation spectrum 11 of the infrared light from the infrared radiation material shows the same spectrum with the black body radiation on the shorter wavelength region but completely reduced on the longer wavelength region from the predetermined wavelength λ0.

The aforementioned formula (4) physically indicates that the radiation loss is suppressed within a low temperature region where the input energy is small, and the term of P(radiation) in the formula (4) becomes zero. Therefore, the energy loss only indicates P(conduction), and the temperature of the material is raised with an extremely high degree of efficiency. When the temperature of the base material becomes higher, reaching a temperature range where the peak wavelength of the black body spectrum 13 at the temperature exceeds the predetermined wavelength λ0, the input energy into the base material is getting to be dissipated in the form of the infrared radiation with the characteristic spectrum 11. Therefore, by using this principle, as described below, it becomes possible to convert the energy from sunlight to electrical energy with an efficiency of 60% or higher.

Figure 2:
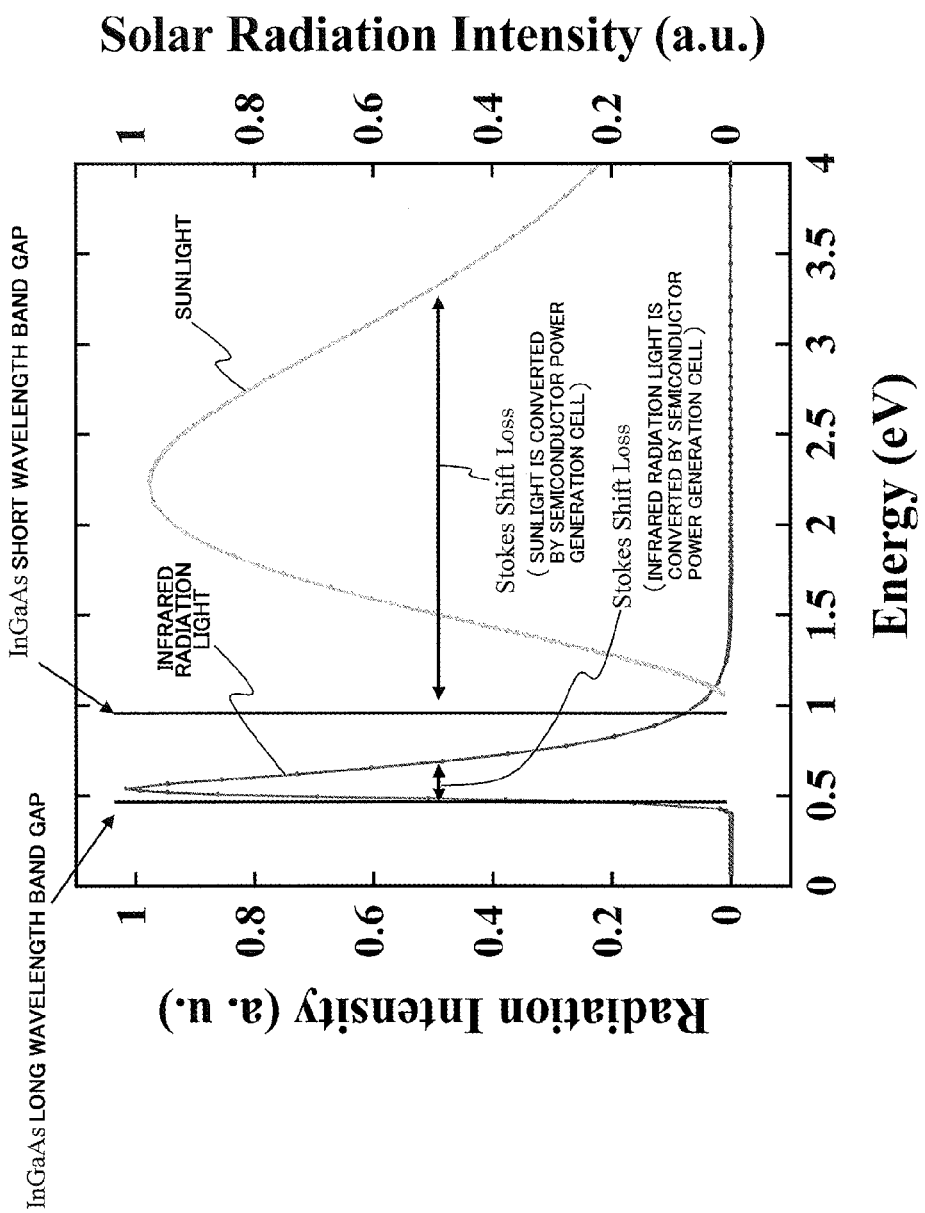
FIG. 2 is a graph showing the Stokes shift upon converting sunlight into electrical energy by a short wavelength band gap semiconductor power generation cell and the Stokes shift upon converting infrared light into electrical energy by a long wavelength band gap semiconductor power generation cell.

In the presently disclosed subject matter, the energy from sunlight positioned in the wavelength 300 nm to 1,500 nm is once converted into infrared light, and this infrared light is further converted into electrical energy by the semiconductor power generation cell. Accordingly, it is possible to reduce an energy difference (referred to as Stokes shift) between the band gap energy of the semiconductor in the semiconductor power generation cell and the solar energy that entered into the semiconductor power generation cell as shown in FIG. 2. By way of example, when the entire energy from sunlight in the range from wavelength 300 nm (4.1 eV) to 1,500 nm (0.8 eV) is assumed to be absorbed by the semiconductor power generation cell and the semiconductor with the band gap around the wavelength 1,500 nm (e.g., power generating cell of InGaAs semiconductor (short wavelength)) is assumed to be used, then the energy difference (Stokes shift) between the sunlight and the band gap becomes larger; especially, in the ultraviolet region of the sunlight, and it causes a large loss (4.1 eV-0.8 eV=3.3 eV loss). In other words, the semiconductor power generation cell whose band gap energy is around 0.8 eV is allowed to generate only 0.8 eV electric energy. Therefore, the solar energy above the band gap becomes a loss and is dissipated by heat.

As described above, in the presently disclosed subject matter, the infrared radiation material having the predetermined reflectance property as indicated by the change curve 10 in FIG. 1 allows generation of infrared light from sunlight (the spectrum 11 in FIG. 1). In this case, the emission energy of this infrared light situates in the range from 0.5 to 1 eV as shown in FIG. 2. Therefore, if conversion is performed by using a semiconductor (InGaAs semiconductor (long wavelength)) power generating cell having the band gap energy of 0.5 eV, for instance, it is possible to suppress the Stokes shift loss, and the maximum loss can be significantly reduced to 0.5 eV. By using this method, the energy from sunlight is allowed to be converted to electrical energy with efficiency of 60% or higher, in a simple device configuration. A specific configuration of the solar thermo-photovoltaic power generator will be explained later in detail.

Figure 3:
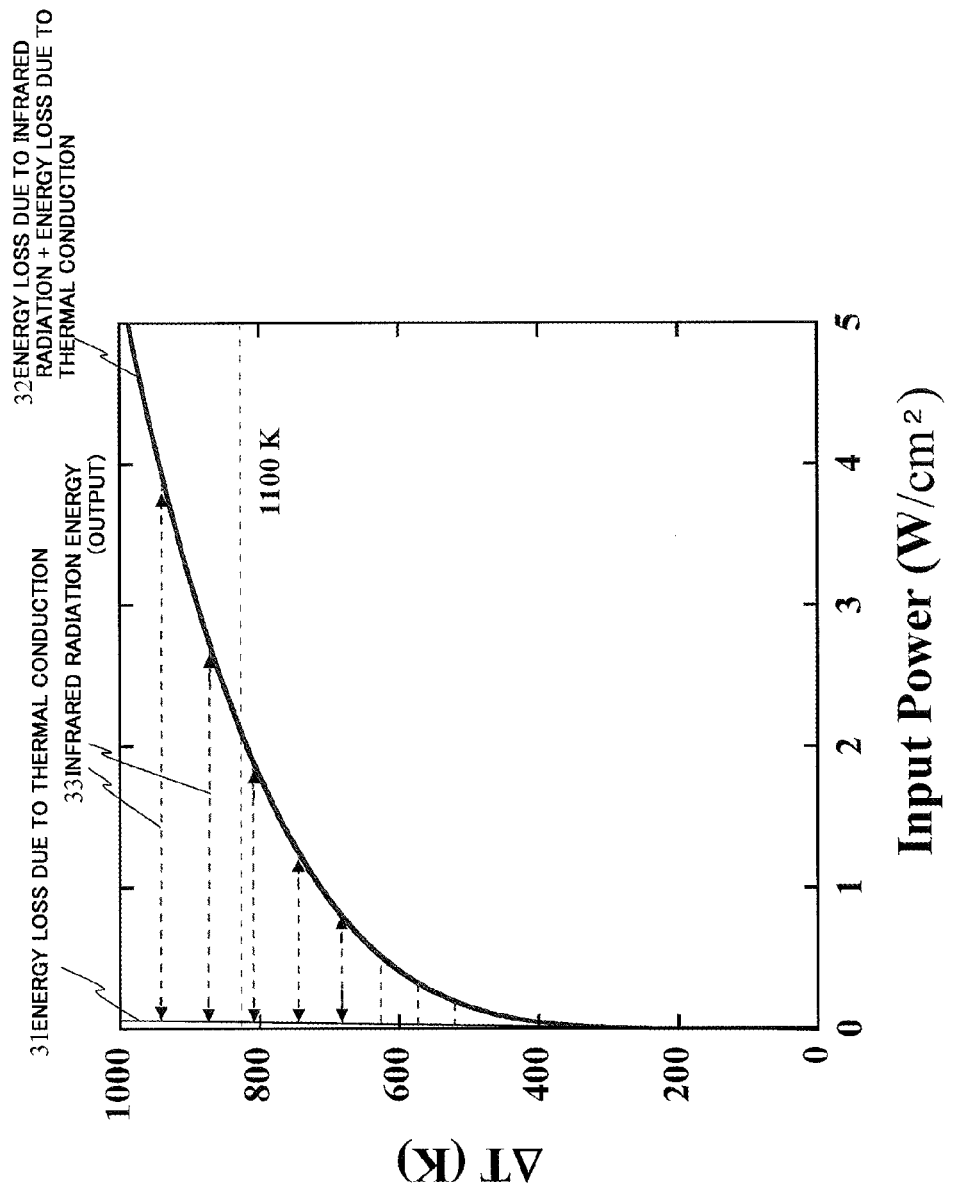
FIG. 3 is a graph showing the temperature change as a function of input power for the evaluation of both the magnitude of thermal conduction loss and the intensity of the infrared radiation from the material having the predetermined reflectance property.

Next, with reference to FIG. 3, a relation between the temperature of the infrared radiation material having the reflectance property as indicated by the change curve 10 in FIG. 1 and the energy being lost (energy loss due to the infrared light radiation and thermal conduction) will be explained. In FIG. 3, the straight line 31 indicates the energy loss due to the thermal conduction of the base material supporting the infrared radiation material, and the curve 32 indicates the total energy loss due to the infrared radiation and the thermal conduction.

When sunlight is collected in the infrared radiation material of 1 cm², the temperature is raised as indicated by the graph 32 in FIG. 3. It is to be noted that FIG. 3 illustrates measurement using the sunlight with intensity of AM 1.5 (0.1 W/cm²) that was collected on the infrared radiation material having the aforementioned reflectance property, by means of a lens or the like. The temperature of the infrared radiation material is measured by thermocouples being around 0.1 mm in diameter, attached closely to the base material.

As shown in FIG. 3, most of the energy from sunlight is utilized for raising the temperature of the base material supporting the infrared radiation material, in the region where the input energy density of the sunlight is low (0 to 0.1 W/cm²). This is because, radiation loss is suppressed in the low temperature region due to the characteristics of the emissivity ∈ of the infrared radiation material shown in FIG. 1, and the input energy is used for raising the temperature of the base material. When the energy from sunlight is collected intensively on the base material and the energy density is increased, the temperature of both the base material and the infrared radiation material is raised. This increase of the temperature causes the shift of the energy dissipation region from the conduction loss to the infrared radiation loss (the region where the wavelength is 2 μm or less and the reflectance is lowered in FIG. 1). Therefore, the temperature of the base material does not change so much from a critical temperature region, resulting in that most of the input energy is changed to the infrared light irradiation. This critical temperature (energy) corresponds to the cutoff wavelength of emissivity (energy) in which the reflectance of the infrared radiation material drops to 0 as shown in FIG. 1. According to the Wien's displacement law, it is possible to estimate the critical temperature and it is about (T=2,898 (μmK)/$\lambda_{Rcutoff}$(μm)=1,160 K (in the case where $\lambda_{Rcutoff}$=2.5 μm)).

The energy obtained as the infrared radiation is equal to the result as shown in FIG. 3, obtained by subtracting the straight line 31 corresponding to a loss due to the thermal conduction, from the curve 32. This corresponds to the amount of radiation energy indicated by the length of the arrow 33 of dotted line as shown in FIG. 3. Obviously from this result, it is found that the higher is the temperature, the larger is the ratio of the infrared radiation. The conversion efficiency from the sunlight to the infrared light is high, being 97% or more, at the temperature of 1,100 K (ΔT=800 K in FIG. 3).

As thus described, by using the infrared radiation material having the predetermined reflectance property as indicated by the change curve 10 in FIG. 1, it is possible to convert sunlight to infrared light with a high degree of efficiency. Therefore, if the infrared radiation material is used, it is possible to generate power with a high degree of efficiency in the state where the Stokes shift is reduced than ever before, by guiding infrared light to the semiconductor power generation cell and converting light to electric power.

(Thermal Power Generator)

Next, the principle of the thermal power generator of the presently disclosed subject matter will be explained. The aforementioned solar thermo-photovoltaic power generator has a configuration in which the infrared radiation material of the heat-light conversion element is heated by sunlight, so as to radiate the infrared light, whereas the thermal power generator transfers the heat directly to the infrared radiation material, thereby radiating infrared light.

Any method such as thermal conduction and radiation may be applicable as a method for transferring heat to the infrared radiation material. By way of example, in the case where the thermal conduction is used, a heat-light conversion element is attached closely to a heat source, thereby transferring heat energy to the infrared radiation material via the thermal conduction, and the material is heated. As already explained in the principle of the solar thermo-photovoltaic power generator with reference to FIG. 2, an infrared radiation material has the reflectance property such as reflectance being 1 on the longer wavelength side and being 0 on the shorter wavelength side from a predetermined infrared wavelength. With this configuration, it is possible to emit the infrared radiation spectrum 11 as shown in FIG. 1.

In the case of the thermal power generator invented here, unlike the solar thermo-photovoltaic power generator, it is not necessary to set the cutoff wavelength $\lambda_{Rcutoff}$ of the reflectance of the infrared radiation material to coincide with the solar spectrum, since it is not the sunlight which heats the material. On the other hand, the cutoff wavelength $\lambda_{Rcutoff}$ of the reflectance of the infrared radiation material is set in accordance with the temperature of the heat source which heats the infrared radiation material. In other words, in the case where the heat source is low in temperature, the peak wavelength of $\lambda_{max}$ of the black body spectrum 13 shown in FIG. 1 shifts to the longer wavelength side according to the Wien's displacement law ($\lambda_{max}$=2,898 (μmK)/T(K)), and therefore, the cutoff wavelength $\lambda_{Rcutoff}$ of the reflectance shown in FIG. 1 is made to shift to the long wavelength side, so as to overlap the change curve 12 of emissivity ∈(λ) with the black body spectrum 13 overlap at a certain band of wavelength. In the case where the heat source is high in temperature, the cutoff wavelength $\lambda_{Rcutoff}$ of the reflectance is made to shift to the short wavelength side. Specifically, when the temperature of the heat source is 100° C., for instance, the cutoff wavelength $\lambda_{Rcutoff}$ of the reflectance is set to be 8 μm, whereas when the temperature of the heat source is 1,000° C., the cutoff wavelength $\lambda_{Rcutoff}$ of the reflectance is set to be 2.5 μm.

With regard to the current-state semiconductor power generation cell, energy gap of the cell which is able to generate power efficiently at room temperature is positioned at short wavelength around 1,500 nm or less, like the given explanation regarding the solar thermo-photovoltaic power generator. Therefore, a high-temperature heat source which radiates the short-wavelength infrared radiation spectrum 11 is possible to generate power more efficiently than a low-temperature heat source.

As described in the explanation for the solar thermo-photovoltaic power generation with reference to FIG. 3, a ratio of the infrared radiation is increased as the temperature of the infrared radiation material becomes higher.

As discussed above, the thermal power generator of the presently disclosed subject matter uses the heat source to heat the infrared radiation material of the heat-light conversion element, allowing radiation of the infrared light and converting this infrared light to electric power by the semiconductor power generation cell, thereby performing thermal power generation.

FIRST EMBODIMENT

Figure 4:
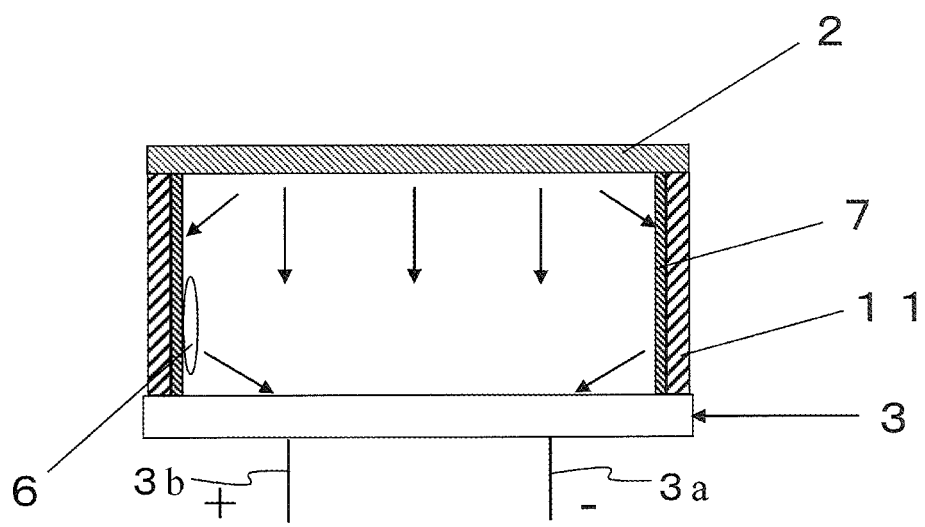
FIG. 4 is a cross-sectional view of a thermal power generator according to the first embodiment.
Figure 5:
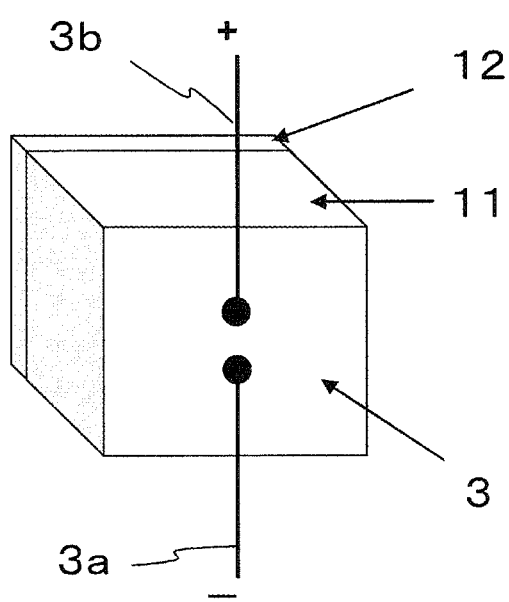
FIG. 5 is a perspective view of the thermal power generator of the first embodiment.
Figure 6:
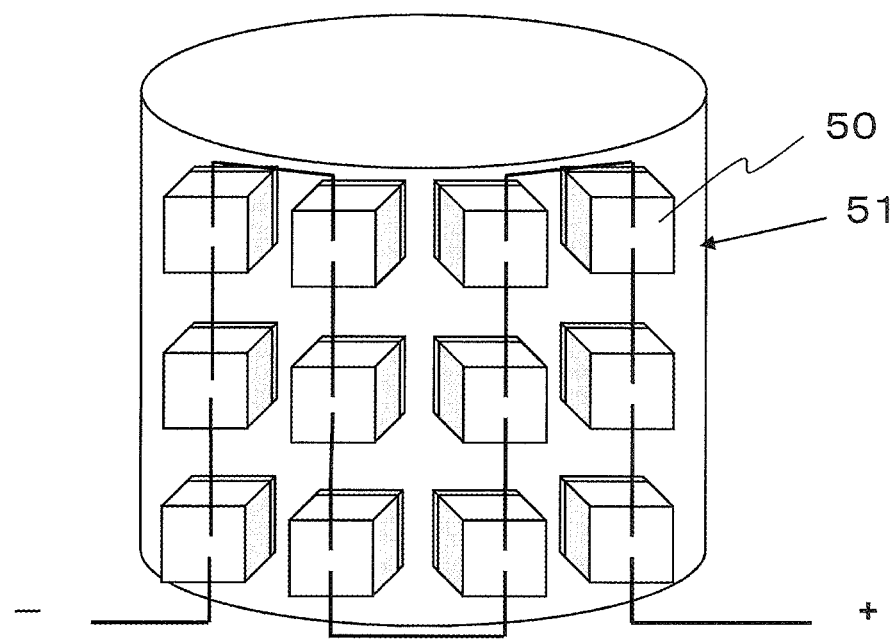
FIG. 6 illustrates the state where multiple thermal power generators are fixed on a heat source, and those multiple thermal power generators are connected in series.

Hereinafter, with reference to FIG. 4, FIG. 5, and so on, there will be explained a thermal power generator as a first embodiment of the presently disclosed subject matter. FIG. 4 is a cross sectional view of the thermal power generator 50, and FIG. 5 is a perspective view thereof. FIG. 6 is a perspective view showing the state that the thermal power generators 50 are fixed on the heat source 51.

The thermal power generator according to the presently disclosed subject matter is provided with a heat-light conversion element 2 and a semiconductor power generation cell 3 being placed in such a manner as opposed to each other, a vacuum vessel 11 sealing those elements against the outside, and a reflection coating 7 placed on the inner wall of the vacuum vessel 11.

Figure 7:
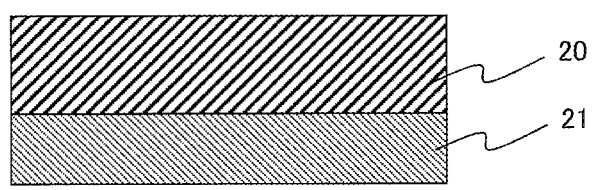
FIG. 7 is a cross-sectional view showing a layer structure of the heat-light conversion element in the thermal power generator as shown in FIG. 4.

The heat-light conversion element 2, whose structure is illustrated in FIG. 7, is provided with a base material 20, and an infrared radiation material layer 21 being mounted on the surface of the base material 20 facing to the semiconductor power generation cell 3. As shown in the change curve 10 in FIG. 1, the infrared radiation material layer 21 has the following reflectance property; the reflectance on the longer wavelength side of a predetermined infrared wavelength is higher than the reflectance on the shorter wavelength side thereof. It is particularly desirable that the reflectance on the shorter wavelength side of the predetermined infrared wavelength is equal to or lower than 5% and the reflectance on the longer wavelength side of the predetermined wavelength is equal to or higher than 95%. The infrared radiation material layer 21 has a single-layered structure or a multi-layered structure and when this material is heated, it radiates infrared light with a high degree of efficiency.

As a specific example of the material (infrared radiation material) layer 21 in which the reflectance (emissivity) changes in stepwise manner, it is possible to employ (i) a laminated body of metal oxide having at least one layer, (ii) a thin film (so called, cermet film) containing fine metallic or semiconductor particles dispersed in an oxide or nitride layer, or (iii) a graphite compound substrate having a structure of microscopic asperities on the surface, or the like. Those materials will be explained in detail in the following.

A material having a high thermal conductivity (e.g., W or Cu) may be used as the base material 20.

In order to reduce the Stokes shift, there is employed a power generation cell as the semiconductor power generation cell 3, having an energy gap being close to the radiation energy emitted from the infrared radiation material layer 21 of the heat-light conversion element 2. By way of example, a power generation cell of InGaAs semiconductor whose energy gap is around 2.5 µm is used.

The reflection coating 7 has a roll to reflect the infrared light radiated from heat-light conversion element 2 to be incident on the semiconductor power generation cell 3. By way of example, an Au film, an Ag film, a dielectric multilayer film, or the like, may be used as the reflection coating 7. It is desirable that a degree of vacuum is higher as possible in the internal space of the vacuum vessel 1, since the higher is it, the more the convective heat transfer is reduced, allowing the heat-light conversion element 2 to convert the heat to infrared light with a high degree of efficiency. Actually, the degree of vacuum is sufficient if it is around $10^{-3}$ to $10^{-4}$ Pa. The vacuum vessel 11 is made of a material being low in thermal conductivity and resistant to high temperature of the heat source (e.g., quartz glass, or metals such as aluminum sintered compact being low in thermal conductivity and stainless steel being low in thermal conductivity). In addition, a getter 6 is evaporated onto the tube wall, thereby enabling the degree of vacuum inside to be maintained for a long term, and extending the life of the thermal power generator. If the reflection coating 7 has a configuration including a Ti film, Ti has a function of the getter, and thus the film also serves as the getter.

Figure 8:
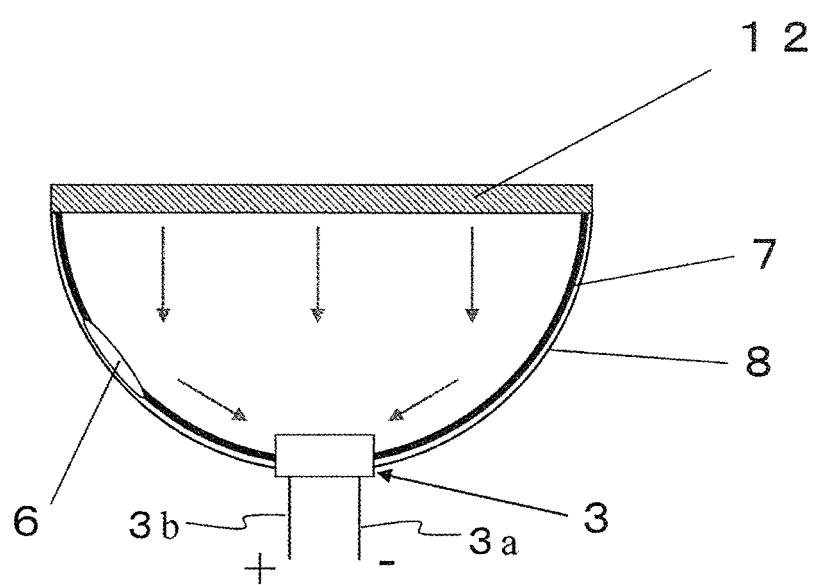
FIG. 8 is a cross-sectional view of another shape example of the thermal power generator of the first embodiment.

In FIG. 4, the size of the semiconductor power generation cell 3 is almost the same as the size of the heat-light conversion element 2. However, as shown in FIG. 8, the area of the upper surface of the semiconductor power generation cell 3 may be smaller than the area of the lower surface of the heat-light conversion element 2. In the case of FIG. 8, the vacuum vessel 11 is formed in a hemispherical shape, thereby allowing the infrared light emitted from the heat-light conversion element 2 to be collected on the semiconductor power generation cell 3.

Operations of each part of the thermal power generator 50 in FIG. 4 will be explained. As shown in FIG. 6, one or more thermal power generators 50 are fixed on the heat source 51 via a high thermal conductive material (e.g., ceramic paste) in such a manner that the heat-light conversion element 2 is attached tightly to the heat source 51. With this configuration, the heat from the heat source 51 is conducted to the infrared radiation material layer 21, thereby heating the infrared radiation material layer 21. The heated infrared radiation material layer 21 radiates infrared light having a predetermined wavelength with a high degree of efficiency. The semiconductor power generation cell 3 is irradiated with the infrared light, directly or after reflected on the inner wall of the vacuum vessel 1.

Figure 9:
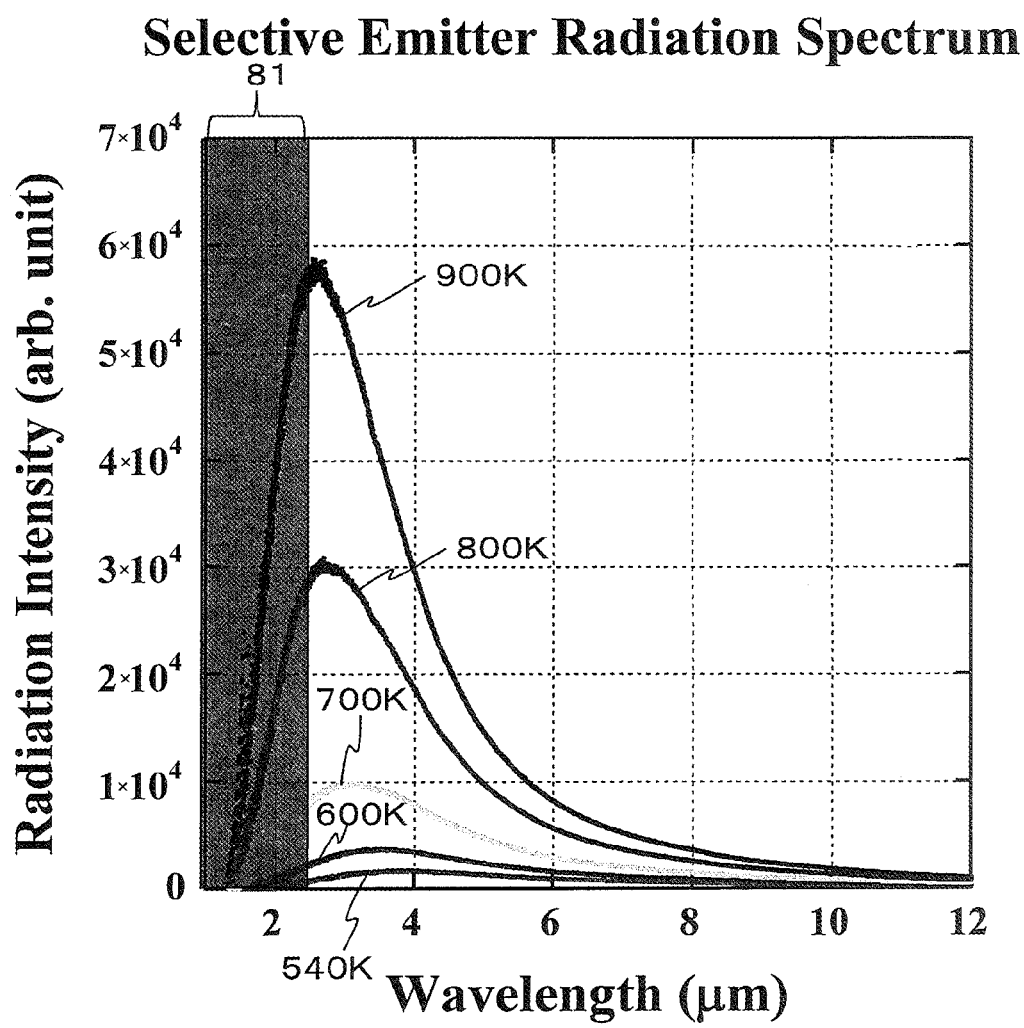
FIG. 9 is a graph showing an infrared radiation spectrum radiated from the heat-light conversion element in the thermal power generator of the first embodiment, and an absorption band 81 of the semiconductor power generation cell.

If the material of the infrared radiation material layer 21 has the cutoff Wavelength $\lambda_{Rcutoff}$=4.0 µm, the infrared light having the spectrum as shown in FIG. 9 is emitted depending on the temperature of the infrared radiation material layer 21. If the band gap of the semiconductor power generation cell 3 has the wavelength of 2.5 µm, energy of wavelength 2.5 µm or less indicated in the band 81 of the infrared radiation spectrum shown in FIG. 9 is absorbed into the semiconductor power generation cell 3, and this energy is converted into electrical energy. The electricity after the conversion may be extracted to the outside from the terminals 3a and 3b of the semiconductor power generation cell 3. In the case where multiple thermal power generators 50 are fixed on the heat source 51, the terminals 3a and 3b are connected in series or in parallel as shown in FIG. 6.

Figure 10:
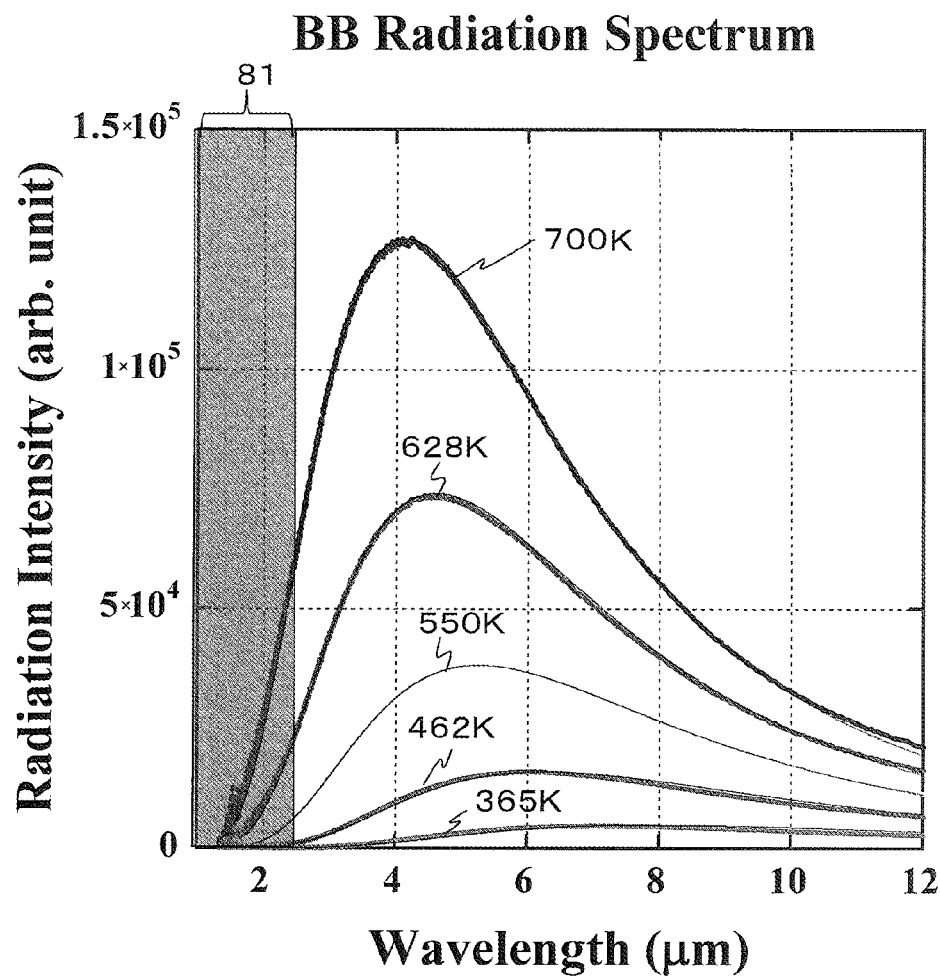
FIG. 10 is a graph showing a black body spectrum of a comparative example and the absorption band 81 of the semiconductor power generation cell.

FIG. 10 shows a black body spectrum as a comparative example. In FIG. 9 in comparison with FIG. 10, since the infrared radiation spectrum radiated from the infrared radiation material layer 21 of the presently disclosed subject matter has a peak wavelength being closer to the absorption band 81 of the semiconductor power generation cell 3, than the peak wavelength of the black body spectrum, it is found that the area of the spectrum overlapping the band 81 is large and therefore this allows an efficient absorption.

Figure 11:
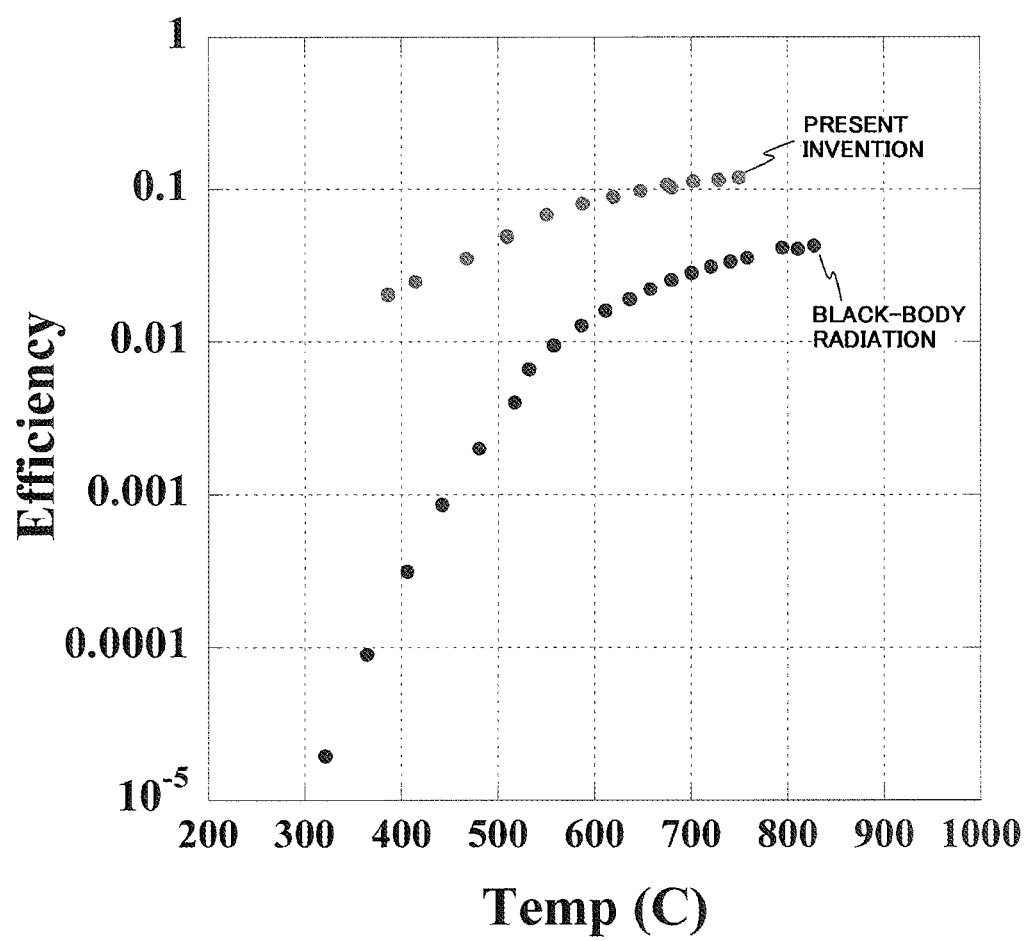
FIG. 11 is a graph showing a power generation efficiency of the semiconductor power generation cell as to the infrared radiation spectrum as shown in FIG. 9, and the power generation efficiency of the semiconductor power generation cell as to the black body spectrum of the comparative example as shown in FIG. 10.

FIG. 11 shows, with respect to each temperature, the power generation efficiency of the thermal power generator of the presently disclosed subject matter, and the power generation efficiency of the thermal power generator in which a black-body radiation material is used instead of the infrared radiation material layer. As shown in FIG. 11, it is found that the thermal power generator of the presently disclosed subject matter is 100 times more efficient in the low temperature region of 400° C., and three times or more efficient in the high temperature region of 700° C., relative to the thermal power generator using the black-body radiation material.

Figure 12:
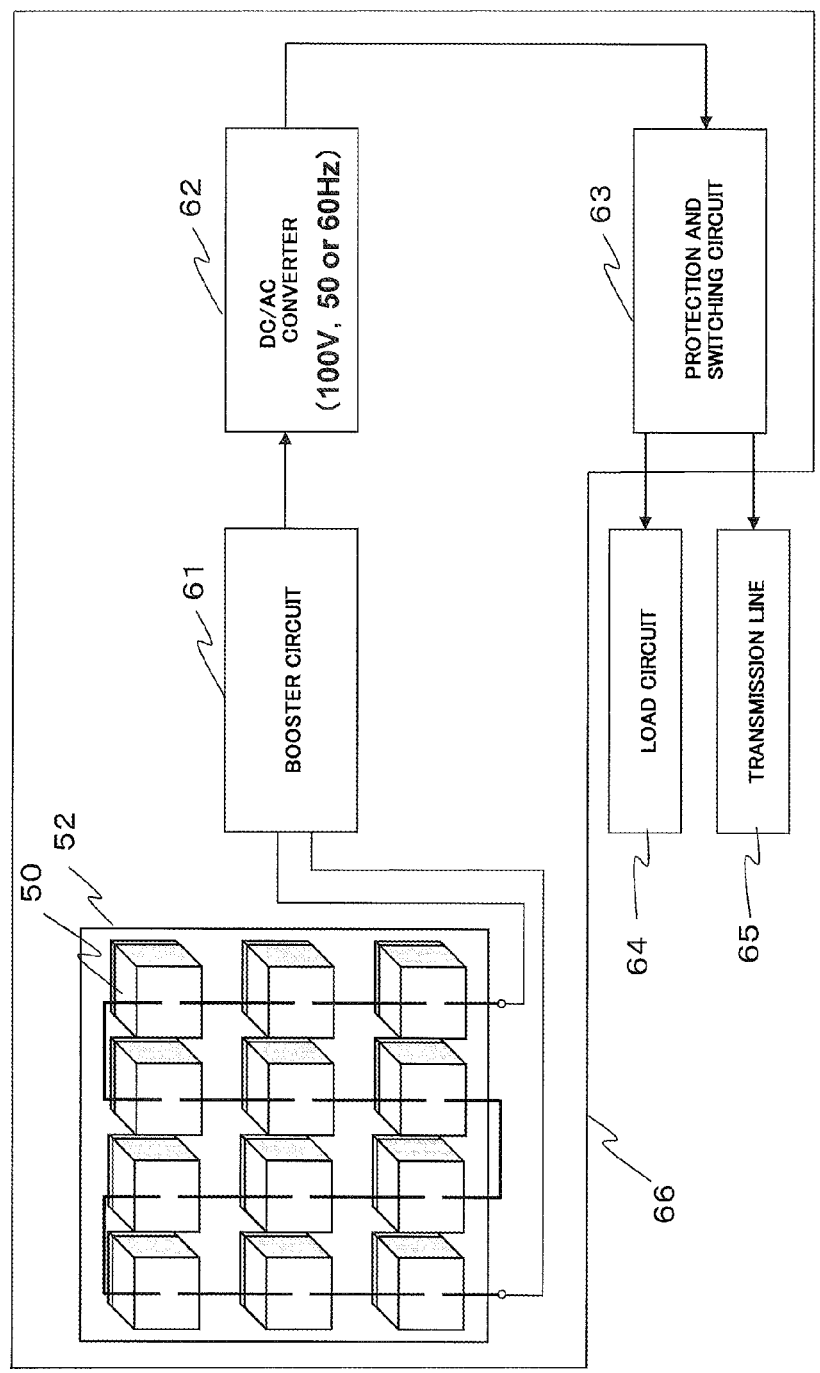
FIG. 12 is a block diagram showing a configuration of the thermal power generation system of the first embodiment.

As shown in FIG. 12, it is alternatively possible to configure such that multiple thermal power generators 50 are fixed in advance on one substrate 52 via a high thermal conductive material, and the substrate 52 is further fixed on the heat source 51 via the high thermal conductive material.

As shown in FIG. 12, one or more thermal power generators 50 are connected with a boosting circuit 61, a DC/AC converter 62, and a protecting and switching circuit 63, sequentially, thereby configuring the power generation system 66. The boosting circuit 61 raises voltage of DC power extracted from at least one thermal power generator 50 up to a predetermined voltage (e.g., 100 V). The DC/AC converter 62 converts the power raised by the boosting circuit 61 to AC power of a predetermined frequency (e.g., 50 Hz or 60 Hz). The protecting and switching circuit 63 supplies this AC power selectively to either a load circuit 64 or a transmission line of an electric power company. Furthermore the protecting and switching circuit 63 supplies surplus power of the load circuit 64 to the transmission line 65. Accordingly, the power generated by the power generation system 66 is able to be supplied to a certain load circuit of a factory or home where the power generation system 66 is installed, and to be used. In addition, the power may be supplied to the transmission line 65 of the electrical power company, thereby selling the power. The protecting and switching circuit 63 not only performs switching operation but also serves as a protective relay that separates and protects the power generation system 66 from the load circuit 64 and the transmission line 65, in the case where abnormally high current flows in the load circuit 64 or the transmission line 65.

Since the size of one thermal power generator 50 of the presently disclosed subject matter corresponds to the size of the heat-light conversion element 2 or the size of the semiconductor power generation cell 3, it is possible to configure a small-sized power generation system 66, by using multiple thermal power generators.

The thermal power generator 50 of the presently disclosed subject matter is allowed to be installed on any heat source in various sizes and shapes, from a small heat source to a large heat source. Therefore, it is possible to generate power more efficiently by utilizing the heat source which has been difficult to be used for conventional power generation by means of a steam turbine. By way of example, the thermal power generator 50 may be fixed on the side wall of a blast furnace or a refuse incinerator, where power is generated by using surplus heat.

In addition, this is based on the principle that infrared radiation is utilized, and therefore in the process of power generation, no waste is generated being an environmental load such as exhaust gas, and it is possible to provide an environmentally conscious thermal power generator.

SECOND EMBODIMENT

As the second embodiment, a configuration of the solar thermo-photovoltaic power generator according to the presently disclosed subject matter will be explained with reference to FIG. 13.

Figure 13:
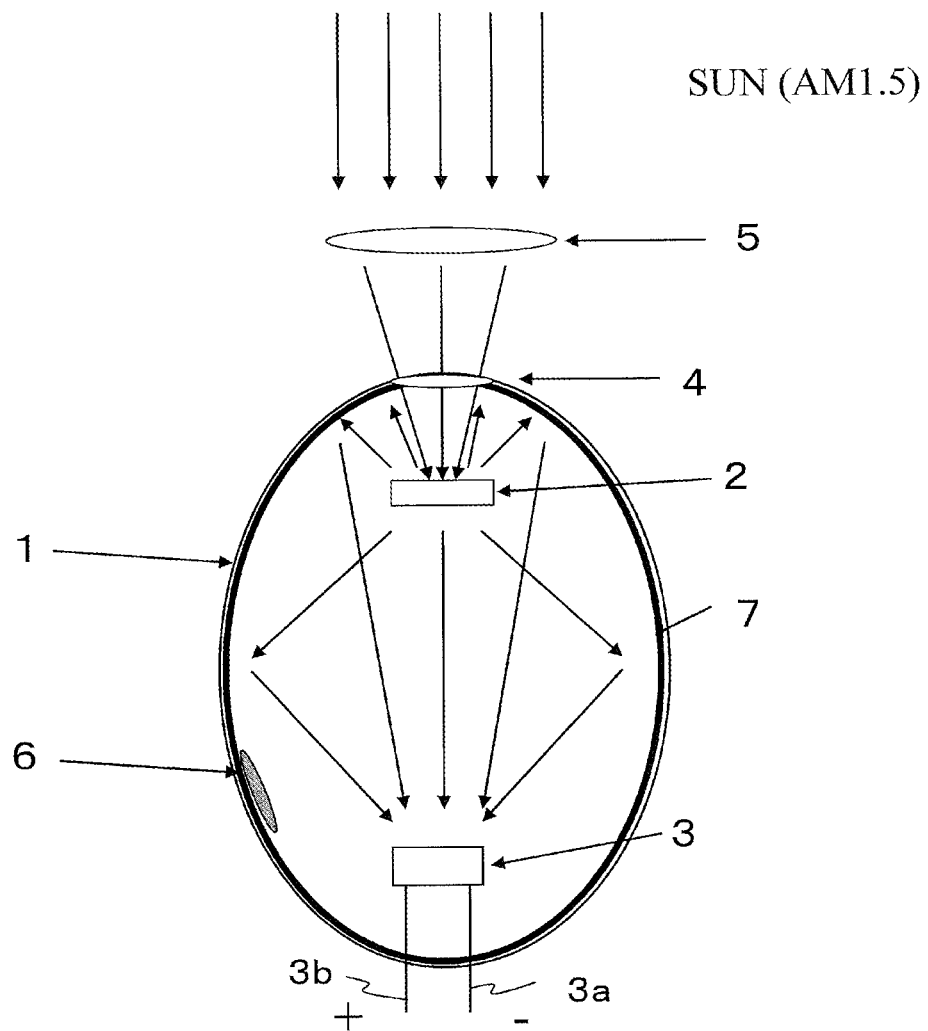
FIG. 13 is a block diagram showing a configuration of a solar thermo-photovoltaic power generator of the second embodiment.

The solar thermo-photovoltaic power generator as shown in FIG. 13 is provided with a vacuum vessel 1 having an inner wall surface in a spheroidal shape, and the heat-light conversion element 2 and the semiconductor power generation cell 3 arranged respectively at elliptical focal points in the inner space of the vacuum vessel 1. A window 4 is arranged on one wall surface in the longitudinal direction of the vacuum vessel 1, in order to allow the sunlight to pass through. The window 4 can be made of a material transmitting the solar spectrum covering a large area including ultraviolet region with large energy, and for example, the window 4 is made of quartz glass.

There is arranged a lens 5 outside the vacuum vessel 1, at the position opposed to the window 4. The lens 5 collects sunlight to the heat-light conversion element 2. It is desirable that the sunlight of 0.1 W/cm$^2$ (AM 1.5) converges to 2 W/cm$^2$ or more via the lens 5. As illustrated in FIG. 3, by collecting the sunlight to approximately 2 W/cm$^2$ or more, the temperature at the infrared radiation material of the heat-light conversion element 2 becomes approximately 1,100 K or higher (temperature rise ΔT=800 K or more), and this enables radiation of the infrared light with a high degree of efficiency. By way of example, as the lens 5, a lens with a light concentrating ratio over 20 times or higher is used, and it is made of a polycarbonate as a material which is high in transmittance. The opening size of the window 4 is designed to be a size which does not act as a shield against the light flux collected by the lens 5, considering the aperture, magnification, and the like, of the lens 5.

The inner wall of the vacuum vessel 1 is covered by the reflection coating 7. In order to further enhance the reflectance of the infrared light being generated, it is also possible to coat the inner side of the window 4 with a short pass filter which allows 100% of sunlight to pass through, and reflects approximately 100% of the infrared light generated from the infrared radiation material 21. This may be implemented by a dielectric multilayer film coating method, which is generally employed. The material of the reflection coating 7 and the degree of vacuum in the vacuum vessel 1 are the same as those in the first embodiment. The operation of the getter 6 is the same as that of the first embodiment.

Figure 14:
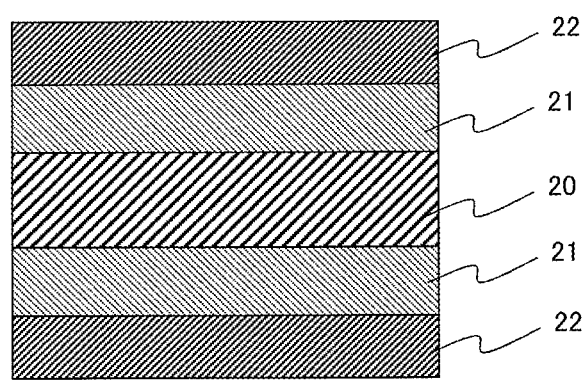
FIG. 14 is a cross-sectional view of the heat-light conversion element in the solar thermo-photovoltaic power generator as shown in FIG. 13.

The structure of the heat-light conversion element 2, whose structure is shown in FIG. 14, is provided with the base material 20, the infrared radiation material layers 21 respectively mounted on the upper and lower surfaces of the base material 20, and antireflection layers 22 deposited on the infrared radiation material layers 21, respectively. The structure of the infrared radiation material layer 21 is the same as that of the first embodiment. It is further possible to configure such that the antireflection layers 22 are not provided. Since the heat-light conversion element 2 and the semiconductor power generation cell 3 are respectively positioned at the focal points of the vacuum vessel 1 being a spheroidal shape, the infrared light radiated from both surfaces of the heat-light conversion element 2 is reflected on the inner wall of the vacuum vessel 1 and collected on the semiconductor power generation cell 3.

The infrared radiation material constituting the infrared radiation material layer 21 has the same reflectance property as that of the infrared radiation material according to the first embodiment, and further, in order to absorb the solar spectrum with a high degree of efficiency, the reflectance R(λ) is low on the shorter wavelength side than near the predetermined wavelength λ0 on the edge of the long wavelength range of the solar spectrum. It is particularly desirable that the reflectance on the short wavelength side of the predetermined wavelength λ0 is 5% or lower, and the reflectance on the long wavelength side of the predetermined wavelength λ0 is 95% or higher. The predetermined wavelength λ0 is set to be a wavelength in the range between or equal to 1 μm to 5 μm. As an example of the infrared radiation material, similar to the first embodiment, it is possible to employ a laminated body of metal oxide, a cermet film, a graphite compound substrate having a structure of microscopic asperities, or the like. Those specific examples will be explained later.

As the semiconductor power generation cell 3, in order to reduce the Stokes shift, there is employed a semiconductor power generation cell with an energy gap being close to the infrared wavelength radiated by the heat-light conversion element 2. Here, an InGaAs semiconductor power generation cell is used, in which the energy gap exists at around 2.5 μm. The size of the semiconductor power generation cell 3 is configured to be almost the same as the size of the heat-light conversion element 2. It is because the infrared rays are reflected by the inner wall of the vacuum vessel 1, so as to be collected on the heat-light conversion element 2, and an image on the surface of the heat-light conversion element 2 is just mapped on the upper surface of the semiconductor power generation cell 3. In here, the size is assumed as approximately 1 cm$^2$, for instance.

Operations of the solar thermo-photovoltaic power generator as shown in FIG. 13 will be explained. The sunlight is collected on the lens 5, passing through the window 4, and further collected on the upper surface of the heat-light conversion element 2. The sunlight passes through the anti-reflection layer 22 and reaches the infrared radiation material layer 21. The heat-light conversion element 2 placed inside the vacuum vessel 1 is designed to be small in energy loss caused by the thermal conduction, and therefore, it is heated to a high temperature by the sunlight. With this configuration, the infrared radiation material layer 21 having the predetermined reflectance property radiates infrared light at the predetermined wavelength with a high degree of efficiency, as described in the explanations as to the principle thereof with reference to FIG. 1 and FIG. 3. The infrared radiation spectrum has a long tail on the short wavelength side as shown in FIG. 1 and FIG. 2.

The infrared light radiated respectively from infrared radiation material layers 21 on both surfaces of the heat-light conversion element 2 is reflected by the reflection coating 7 on the inner wall of the vacuum vessel 1, and collected on the upper surface of the semiconductor power generation cell 3 placed on the focal point of the spheroid 1. Since the semiconductor power generation cell 3 has the energy gap close to the infrared light being radiated, it is possible to absorb the infrared light and generate power efficiently. The electricity after the conversion is allowed to be extracted from the terminals 3a and 3b to the outside.

THIRD EMBODIMENT

Figure 15:
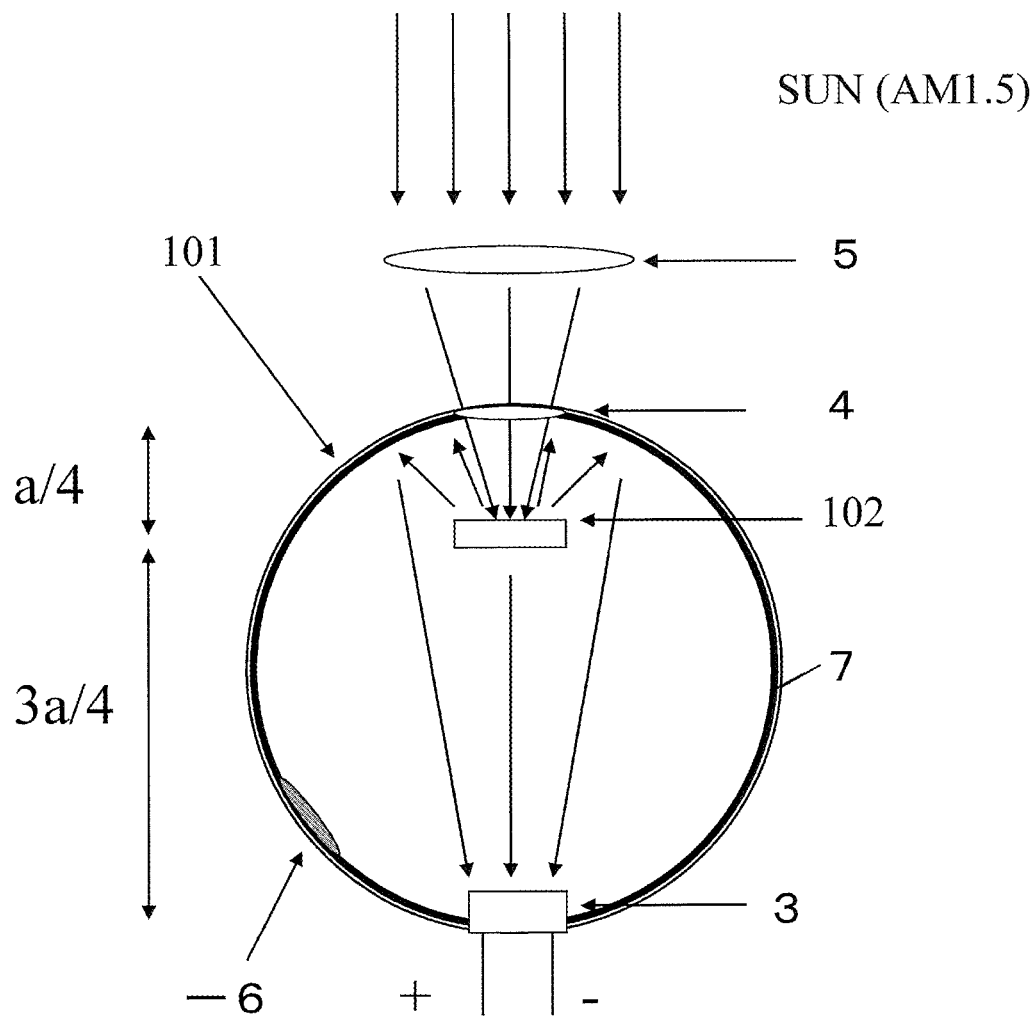
FIG. 15 is a block diagram showing a structure of the solar thermo-photovoltaic power generator of the third embodiment.

As the third embodiment, the solar thermo-photovoltaic power generator as shown in FIG. 15 will be explained.

The solar thermo-photovoltaic power generator as shown in FIG. 15 is different from the solar thermo-photovoltaic power generator as shown in FIG. 13 in the shape of the vacuum vessel 101 and the structure of the heat-light conversion element 102.

The vacuum vessel 101 according to the third embodiment has a spherical shape, and as shown in FIG. 15, the heat-light conversion element 102 and the semiconductor power generation cell 3 are placed respectively at a distance 1/4 a and a distance 4/4 a from the window 4 in the optical axis direction. In other words, the semiconductor power generation cell 3 is placed on the wall surface of the vacuum vessel 101. This position is obtained by calculation of paraxial ray approximation. With this configuration, it is possible to reflect the infrared light radiated from the heat-light conversion element 102 by the inner wall of the vacuum vessel 101, and collect the infrared light on the semiconductor power generation cell 3.

Figure 16:
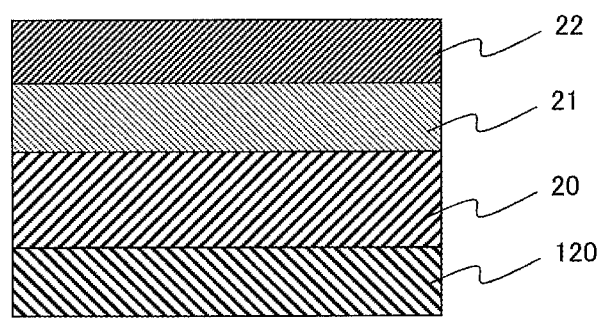
FIG. 16 is a cross-sectional view of the heat-light conversion element in the solar thermo-photovoltaic power generator as shown in FIG. 15.

It is to be noted that as shown in FIG. 16, the heat-light conversion element 102 is provided with the infrared radiation material layer 21 and the anti-reflection layer 22 only on the upper surface side (the side facing to the window 4) of the base material 20. This is because the infrared light radiated from the lower surface side is not able to be collected onto the semiconductor power generation cell 3, since the vacuum vessel 101 has the spherical shape. In addition, the lower surface of the base material 20 is coated with a layer of a material 120 being low in emissivity across the entire wavelength range, an Ag layer, for example, in order to reduce a loss of emission from the lower surface of the base material 20 due to the black-body radiation.

Other configurations and function effects of each part are the same as the solar thermo-photovoltaic power generator of the second embodiment, and therefore, tedious explanations will not be made.

It is to be noted that in the second embodiment and the third embodiment, examples are explained respectively using the spheroid vacuum vessel 1 and the spherical vacuum vessel 101. However, such geometric shape of the vacuum vessel is not limited to those shapes, but various shapes, such as a parabolic body of revolution may be applicable. In order to collect light more efficiently, it is desirable to collect also the infrared light radiated from the heat-light conversion element 12 or 102 at a large angle onto the semiconductor power generation cell. Therefore, it is further desirable to utilize an already-existing optical simulator, or the like, to simulate in detail, the shape of the vacuum vessel, and the shapes of the heat-light conversion element and the semiconductor power generation cell, so as to provide a contrivance such as adding a curve to some extent.

Figure 17:
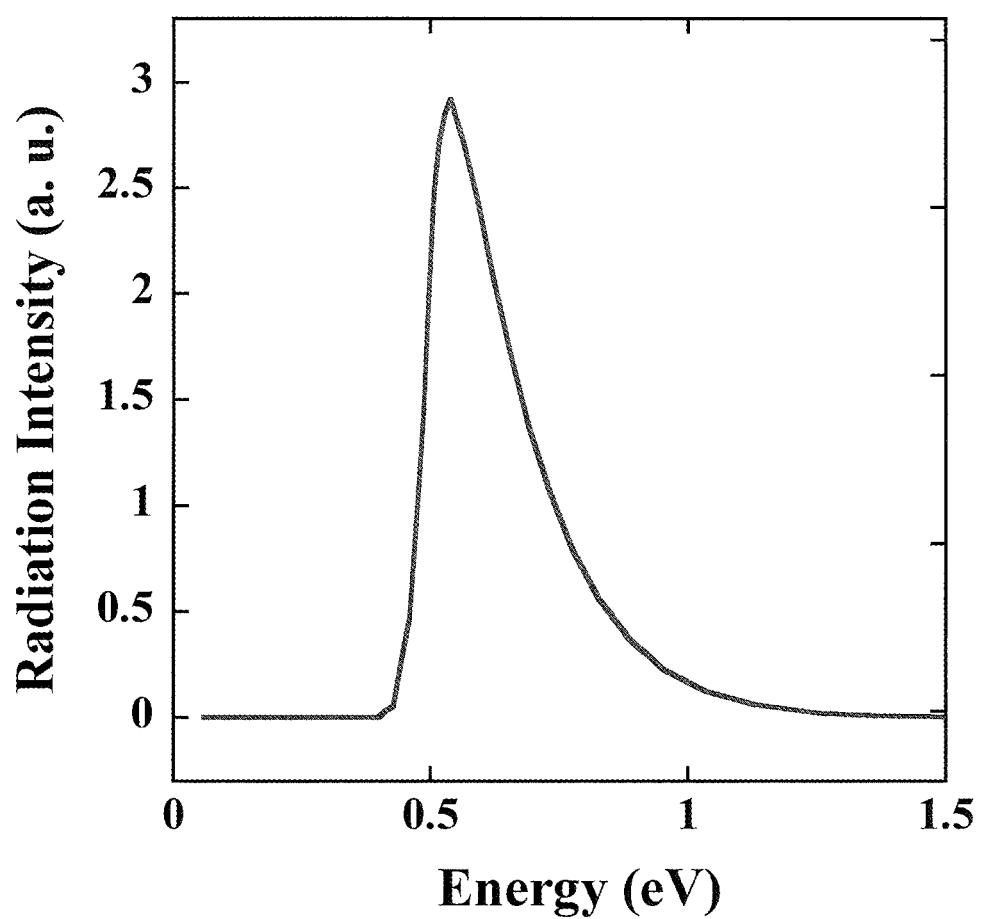
FIG. 17 is a graph showing one example of the spectrum of infrared rays radiated from the heat-light conversion element of the present embodiment.

Here, theoretical efficiency n of electric power generation will be explained, which is obtained by collecting sunlight to the solar thermo-photovoltaic power generator of the presently disclosed subject matter. The efficiency n is obtained based on the infrared radiation spectrum S(x) (here, x represents energy) radiated from the infrared radiation material layer 21 as shown in FIG. 17, and the following formula (5).

$$\eta = (Eg\int S(x)dx)/(\int S(x)x\,dx) \quad (5)$$

If the band gap energy Eg in InGaAs of the semiconductor power generation cell 3 is assumed as equal to 0.5 eV, $\eta=0.35/0.45=0.78$. Therefore, it is possible for a single solar thermo-photovoltaic power generator to obtain approximately 78% of efficiency.

It is to be noted that in order to obtain efficient power generation, it is conceivable to stack cells respectively having high band gap energy and low band gap energy, similar to the compound semiconductor power generation cell which is conventionally used. By taking the method as described above, it is possible to obtain conversion efficiency, being close to 90%.

Realistically, the semiconductor power generation cell 3 is not able to generate the entire band gap energy Eg=0.5 eV, and approximately 60 to 70% of energy is usable. Therefore, actually, it is conceivable that the efficiency of 78%×(0.6 to 0.7)=46.8% to 54.6% is achieved.

Figure 18:
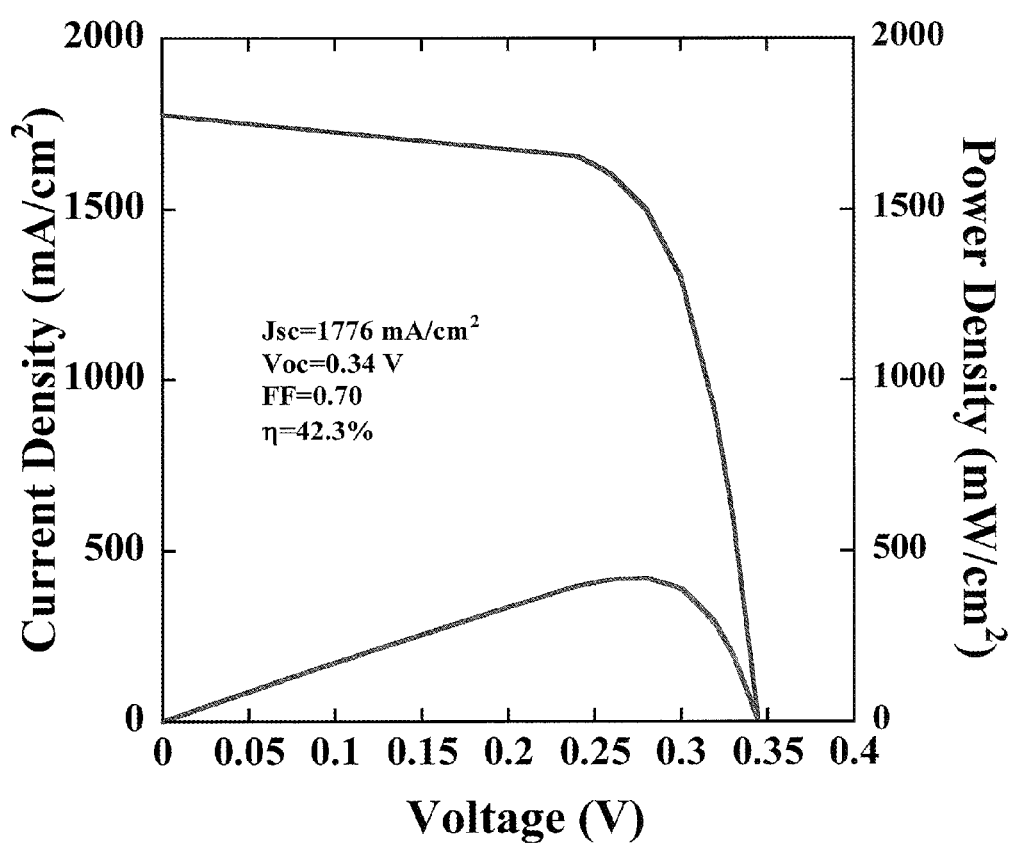
FIG. 18 is a graph showing the results of power generation efficiency of the solar thermo-photovoltaic power generators according to the second and third embodiments.

On the other hand, in order to evaluate the conversion efficiency of the solar thermo-photovoltaic power generator according to the presently disclosed subject matter, a solar simulator was used to measure current-voltage characteristics of the solar thermo-photovoltaic power generator of the presently disclosed subject matter, using a single joined cell (InGaAs) under the condition that AM 1.5 (100 mW/cm$^2$ radiation intensity) and light concentrating ratio 10 times, and following characteristics were obtained as shown in FIG. 18; short-circuit current density Isc=1,776 mA/cm$^2$, open circuit voltage Voc=0.34 V, and fill factor FF=0.70. Final conversion efficiency obtained from those current-voltage characteristics was 42.3%. A discrepancy between the conversion efficiency of this experimental result (42.3%) and the aforementioned conversion efficiency forecasted theoretically (54.6%) is caused by the reflection loss at the condensing lens 5 (3%), incidence loss onto the vacuum vessel 1 (3%), reflection loss on the sunlight infrared conversion element 2 (2%), light guiding/reflection loss on the reflection coating 7 (5%), reflection loss on the semiconductor power generation cell 3 (5%), wavelength dependence of spectral sensitivity response curve of the semiconductor power generation cell (5%), and the like. Among those losses, the reflection loss on the condensing lens 5 (5%), incidence loss onto the vacuum vessel 1 (3%), light guiding/reflection loss on the reflection coating 7 (5%), and reflection loss on the semiconductor power generation cell 3 (5%) may be reduced to approximately to 0%, by employing a non-reflective coating or optimizing the geometric shape of the vacuum vessel 1. In addition, the reflection loss on the semiconductor power generation cell 3 may be reduced to approximately to 0%, by fabricating a texture structure onto the surface of the semiconductor power generation cell 3, or the like, which is generally used in a solar battery technique.

Using the aforementioned solar thermo-photovoltaic power generator of the presently disclosed subject matter enables solar thermo-photovoltaic power generation, highly efficient, at low cost, and with a longer operating life.

First Example of the Infrared Radiation Material

A specific example of the infrared radiation material layer 21 used in the heat-light conversion element 2 will be explained, which is employed in the thermal power generator of the first embodiment, and the solar thermo-photovoltaic power generator of the second and third embodiments.

Figure 19:
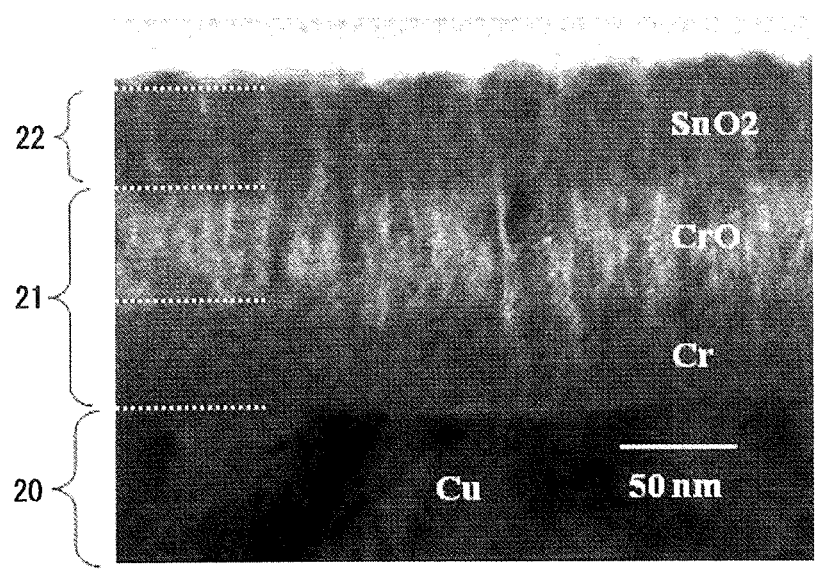
FIG. 19 is a photograph showing a cross-sectional structure of infrared radiation material of the heat-light conversion element as shown in FIG. 14.

Firstly, a specific example will be explained in the case where a laminated body made of at least one layered metal oxide is employed as the infrared radiation material layer 21. As shown in FIG. 19, a layer of CrO as the infrared radiation material layer 21 and a layer of $SnO_2$ as an antireflection coating 22 are sequentially laminated on the base material 20, and those laminated layers are also used as the infrared radiation material layer 21. More specifically, Cu is used as the base material 20, the film thickness of the CrO layer being the infrared radiation material layer 21 is assumed as approximately 100 nm, and the film thickness of the $SnO_2$ layer being the antireflection coating 22 is assumed as approximately 50 nm. It is further possible to place an additional Cr layer between the CrO layer and the base material 20. Each of those layers may be formed by a sputtering method, or the like.

Figure 20:
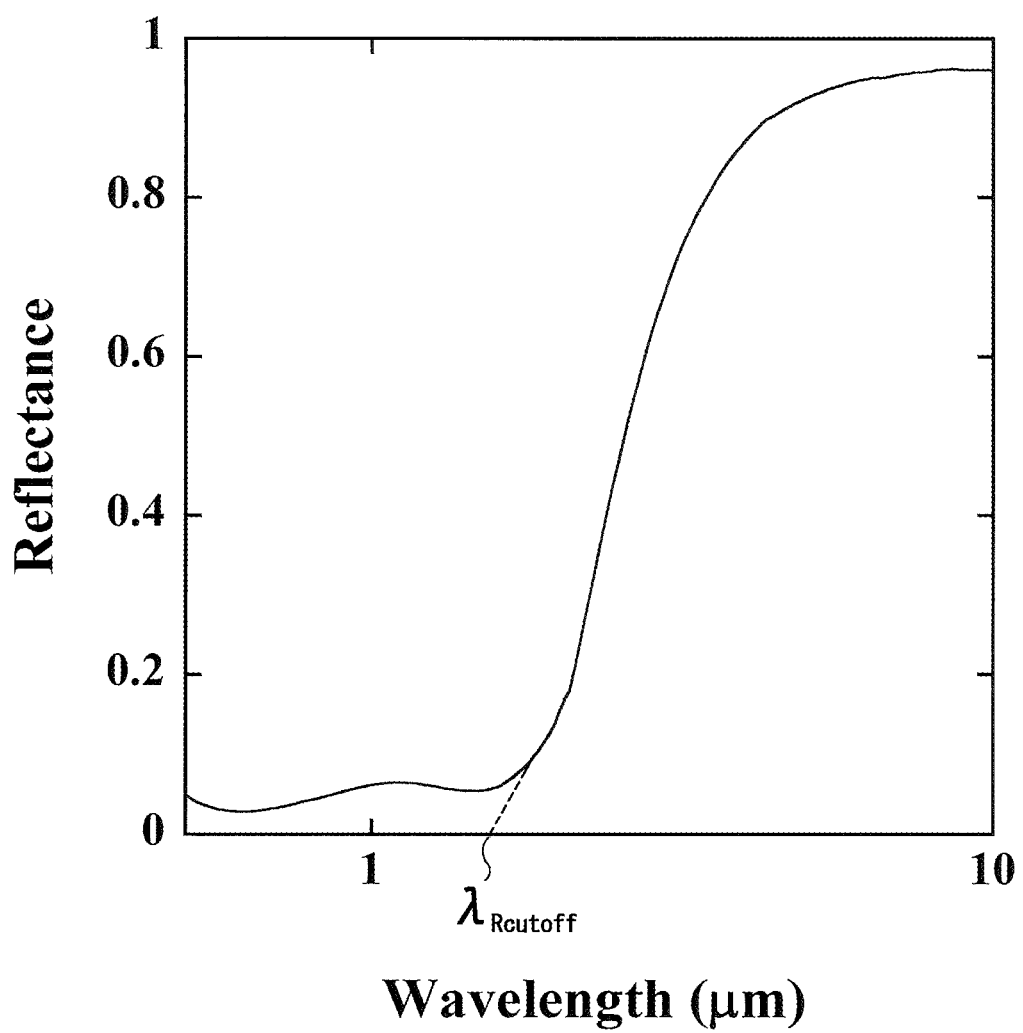
FIG. 20 is a graph showing the reflectance spectrum of the infrared radiation material as shown in FIG. 19.

The reflectance of the infrared radiation material layer 21 as shown in FIG. 19 changes in stepwise manner, when $\lambda_{Rcutoff}$ is equal to around 2 μm as shown in FIG. 20.

In addition, the wavelength $\lambda_{Rcutoff}$ where reflectance changes in stepwise manner may be variable, by changing the ratio between Cr and O, the ratio between Sn and O, and the film thickness thereof, with regard to the CrO layer and the $SnO_2$ layer.

Second Example of the Infrared Radiation Material

A thin film (so-called cermet film) which contains fine metallic or semiconductor particles in a dielectric layer being oxide or nitride may be used as the infrared radiation material layer 21. In order to form the cermet film, it is possible to use MgO (melting point 3,100 K) as the dielectric material, and W (3,700 K), Mo (2,900 K), or Re (3,500 K) can be used as the metal, since they have high melting points.

For example, MgO and W are simultaneously sputtered on both surfaces of the W base material 20, thereby forming a cermet film (thickness around 800 Å) containing W fine particles in MgO, and this cermet film is used as the infrared radiation material layer 21. With this configuration, the reflectance property is able to be maintained even in the temperature region of 3,000 K, and thus it is possible to obtain highly efficient and long lasting heat-light conversion element 2.

It is to be noted that in order to enhance the adhesion between the cermet film (infrared radiation material layer 21) and the W base material 20, it is further possible to configure the cermet film as a concentration gradient film in which the concentration of W metal is high in the region near the W base material 20, and the concentration of W metal becomes lower with increasing distance from the W base material 20.

Forming an Mo metallic layer with thickness of around 1,000 Å according to vapor deposition, or the like, between the W base material 20 and the cermet film (infrared radiation material layer 21) may strengthen the adhesion between the W base material and the cermet film. It is to be noted that since the melting point of Mo metal is low, being 2,900 K, and thus it should be used within the temperature range lower than this (e.g., 2,500 K).

It is desirable that a concentration ratio (volume fraction of W to MgO) of the cermet film (infrared radiation material layer 21) is between or equal to approximately 5% to 50%.

Figure 21:
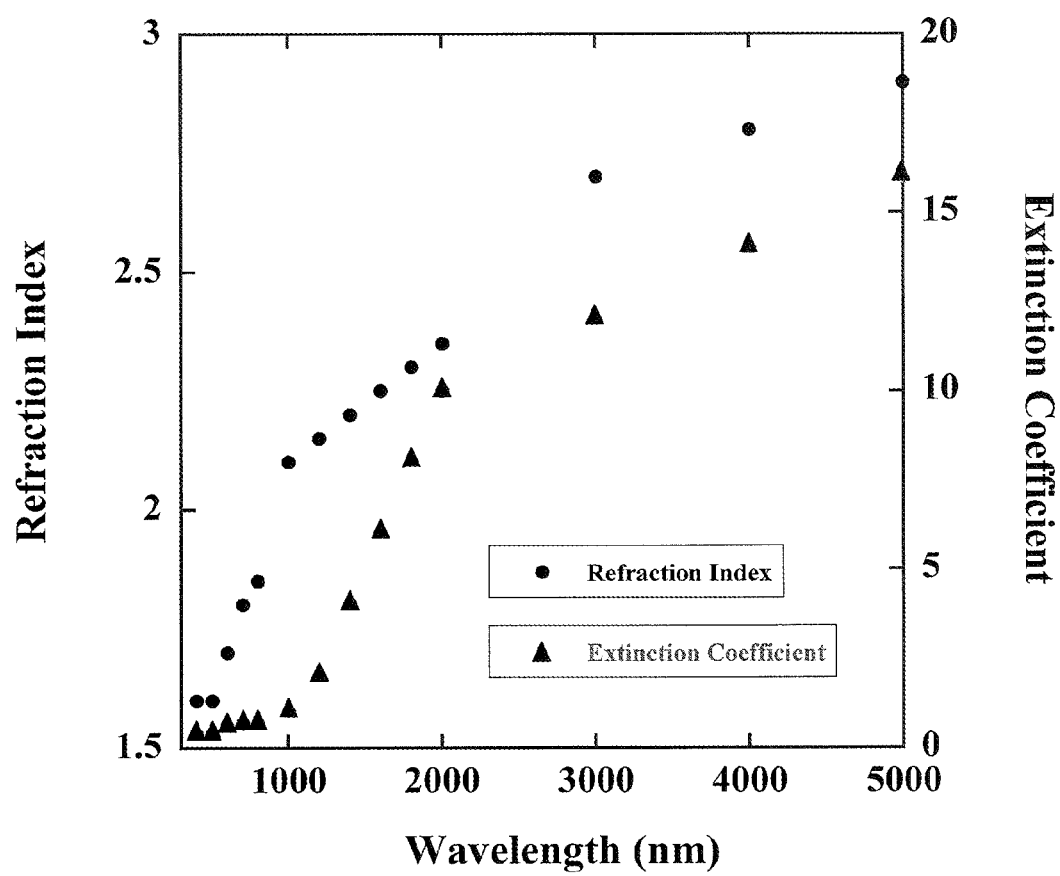
FIG. 21 is a graph showing the refraction index and the extinction coefficient (absorption coefficient) versus wavelength for the cermet film 21 made of MgO+W (800 Å) according to the present embodiment.
Figure 22:
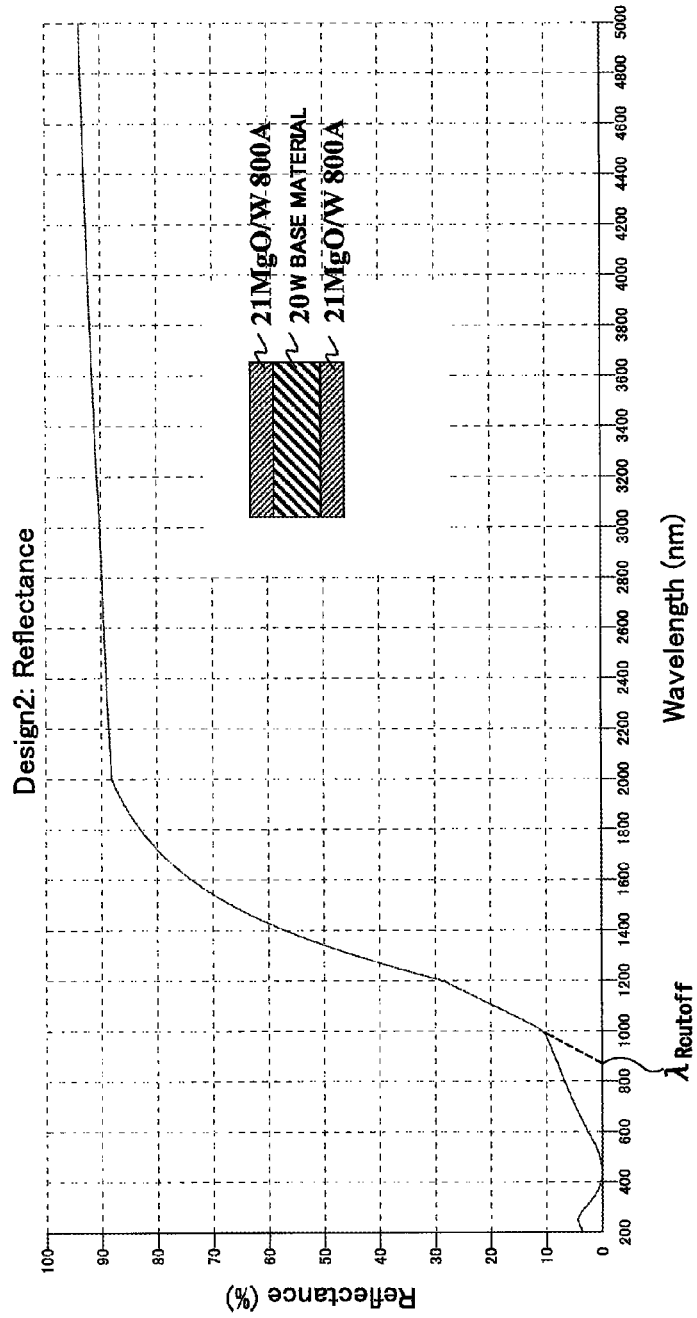
FIG. 22 is a graph showing the reflectance spectrum of the cermet film as shown in FIG. 21.

FIG. 21 shows the wavelength dependence of the refraction index and extinction coefficient (absorption coefficient), with regard to the cermet film 21 of MgO+W (800 Å). FIG. 22 shows a result obtained by calculating the wavelength dependence of reflectance, based on the optical constants. As shown in FIG. 22, this cermet film shows a change of reflectance when the wavelength $\lambda_{Rcutoff}$ is equal to around 0.9 μm. In addition, since materials of W and MgO are used, the reflectance property as shown in FIG. 22 is able to be maintained stably even at the high temperature range around 3,000 K. Therefore, it is possible to provide the heat-light conversion element 2 which is stable even when heated up to high temperature.

In addition, since $\lambda_{Rcutoff}$ is able to be changed, by changing the ratio between Mg and O of the cermet film, the ratio between MgO and W, and further changing the film thickness, those values are designed depending on the wavelength of desired infrared light.

Figure 23:
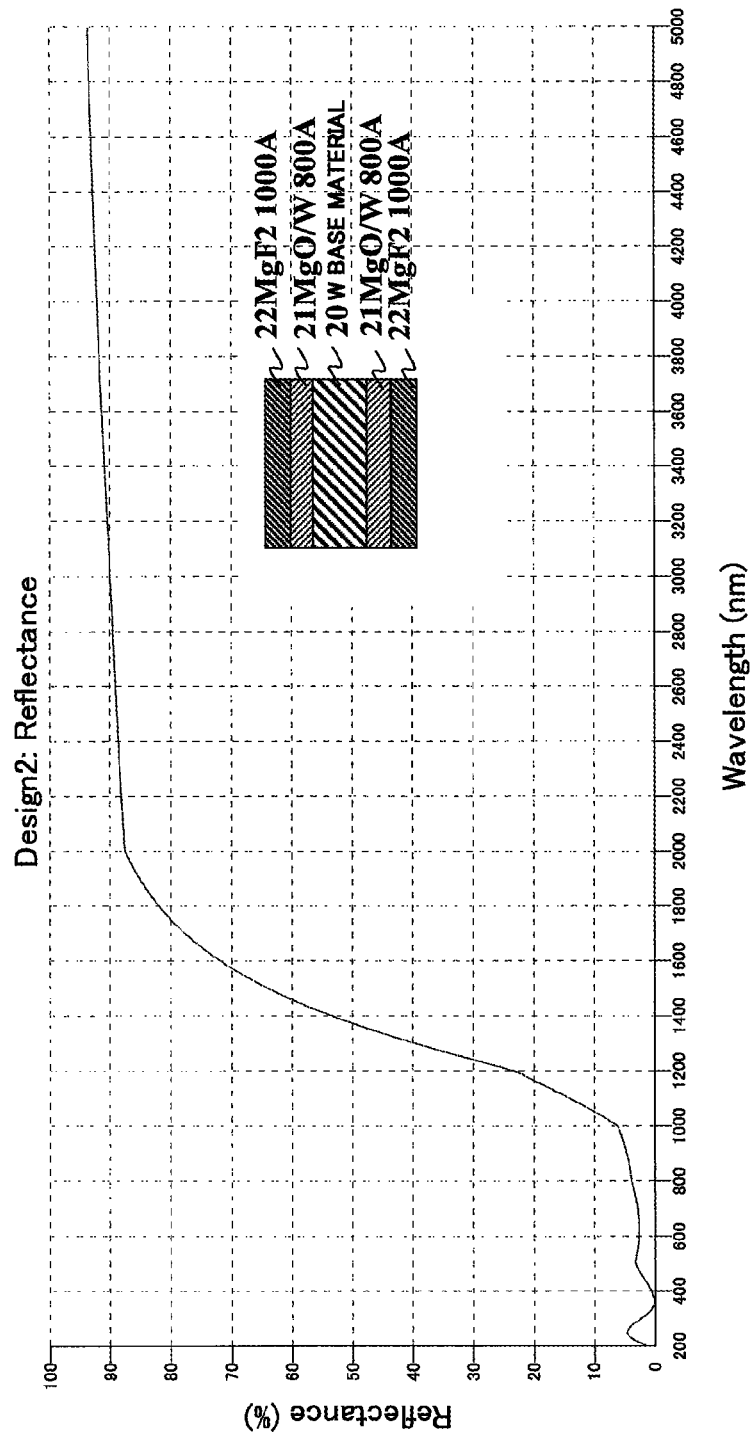
FIG. 23 is a graph showing the reflectance property in the case where an antireflection coating is deposited on the cermet film as shown in FIG. 21.

Furthermore, as the antireflection coating 22, a film made of material having low refraction index (around 1.4 in a visible region) such as $MgF_2$ is formed on the cermet film, and it is possible to obtain a reflectance curve in which the reflectance is reduced more in the visible region as shown in FIG. 23. With this configuration, it is possible to obtain more efficient heat-light conversion element 2. It is to be noted that the reflectance curve as shown in FIG. 23 is calculated under the condition that the $MgF_2$ (refraction index=1.38) film being 1000 Å in thickness is deposited on the aforementioned MgO+W (800 Å) cermet film.

Third Example of the Infrared Radiation Material

A graphite compound substrate whose surface is provided with a structure of microscopic asperities may be used as the infrared radiation material layer 21. Since the melting point of the graphite compound exceeds 4,000 K, it is possible to obtain the infrared radiation material layer 21 being stable and resistant to deterioration upon heated up to high temperature.

Figure 24:
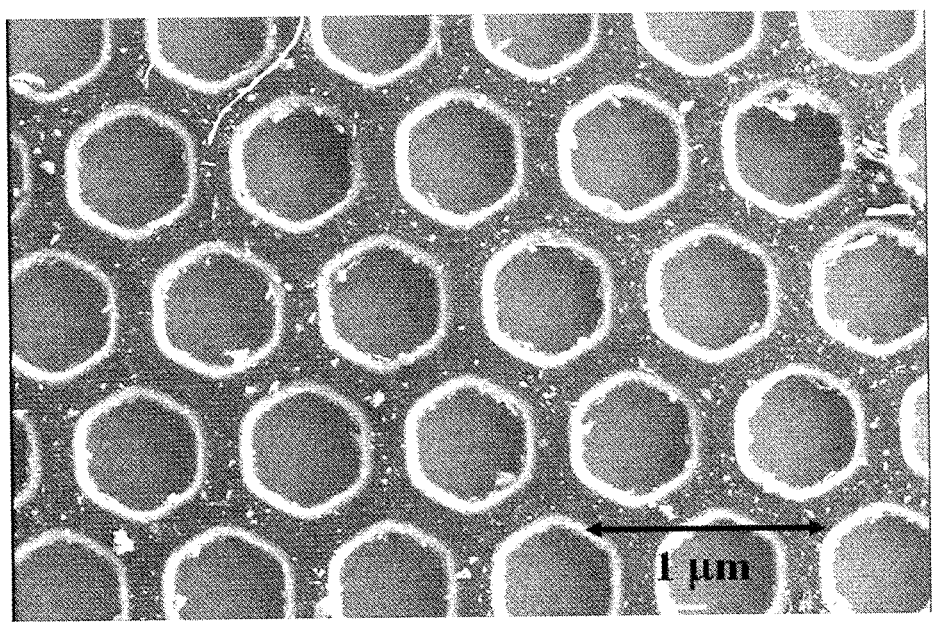
FIG. 24 is a photograph showing a surface profile of a graphite compound whose surface is provided with a structure of microscopic asperities according to the present embodiment.
Figure 25:
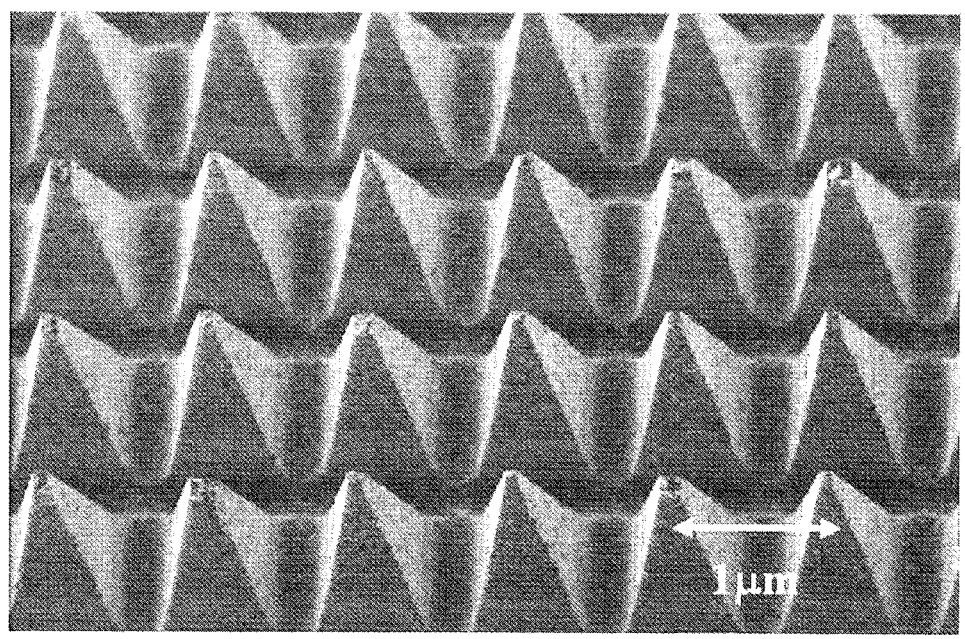
FIG. 25 is a photograph showing another example of the surface profile of the graphite compound whose surface is provided with a structure of microscopic asperities according to the present embodiment.

Here, by way of example, the structure of asperities as shown in FIG. 24 or FIG. 25 is formed. This structure of asperities is formed in such a manner that a structure of periodic asperities on the order of nanometers is formed in superimposed manner on a structure of periodic asperities on the order of micrometers. The regularly-arranged periodic structure (structure of asperities) on the order of micrometers generates a two-dimensional photonics crystal effect, thereby producing effects such as increasing reflection of long wavelength component equal to or longer than a predetermined wavelength (e.g., 2 μm), and inhibiting the absorption. Another structure of asperities on the order of nanometers is formed on this structure of asperities on the order of micrometers, thereby producing a material whose reflectance is close to 1 when the wavelength is equal to or longer than the predetermined wavelength (e.g., 2 μm) and when the wavelength is shorter than the predetermined wavelength, the reflectance is close to 0. Specifically, it is possible to provide the infrared radiation material layer 21, having the reflectance is less than 1% in the wavelength range of 0.3 to 1.5 μm as indicated by the black line in FIG. 26, and the reflectance rises from the point $\lambda_{Rcutoff}$=around 2 μm, reaching high 95% or higher when the wavelength is 5 μm, as indicated by the black line in FIG. 27.

Here, an explanation will be made as to a method for forming on the surface of the graphite compound base material, a microscopic structure on the order of nanometers as shown in FIG. 24 or FIG. 25. In the following method, the structure of asperities on the order of micrometers is formed in the first step, and it is further processed in the second step to form the structure of asperities on the order of nanometers on the surface of the structure of asperities on the order of micrometers. The structure of asperities on the order of micrometers is formed in the first step, thereby allowing the average reflectance to be low (around 20 to 30%) when the wavelength is between or equal to 0.3 and 2 μm, and allowing the average reflectance to be high when the wavelength is between or equal to 2 to 15 μm. In the second step, another structure of asperities on the order of nanometers is formed, thereby further allowing the average reflectance to be much lower (1.5% or less) when the wavelength is between or equal to 0.3 to 2 μm, and allowing the average reflectance to be much higher when the wavelength is between or equal to 2 to 15 μm.

In the first step, a structure of regularly-arranged periodic asperities on the order of micrometers is formed. As a forming method, photolithography and etching technique using a metal mask are employed. Plasma etching using $H_2$ and $O_2$ gas, which allows etching on a carbon-based material, reactive ion etching (RIE) which achieves a higher aspect ratio, or the like, may be employed as the etching technique. Thereafter, the metal mask portion is removed by acid cleaning.

Alternatively, applying mechanical microprocessing using a cutting blade having extremely steeply-angled surface and a grinding stone, and polishing technology, may allow preparation of an overall structure of asperities on the order of micrometers on the graphite compound substrate.

In the second step, the structure of asperities on the order of micrometers prepared in the first step is further subjected to hydrogen plasma etching using microwave plasma, or the like, thereby forming the structure of periodic asperities on the order of nanometers. Conditions of the hydrogen plasma etching may be within the following ranges, for instance, RF power: from 100 to 1,000 W, pressure: from 1 to 100 torr, hydrogen flow rate: from 5 to 500 sccm, etching time: from 1 to 100 min. It is to be noted that the conditions of the hydrogen plasma processing depend on equipment, and the aforementioned parameter values are just examples.

Reactant gas used for the etching in the second step is not limited to $H_2$ gas. Similar effects are expected by using Ar, $N_2$, $O_2$, $CF_4$, or the like.

Figure 26:
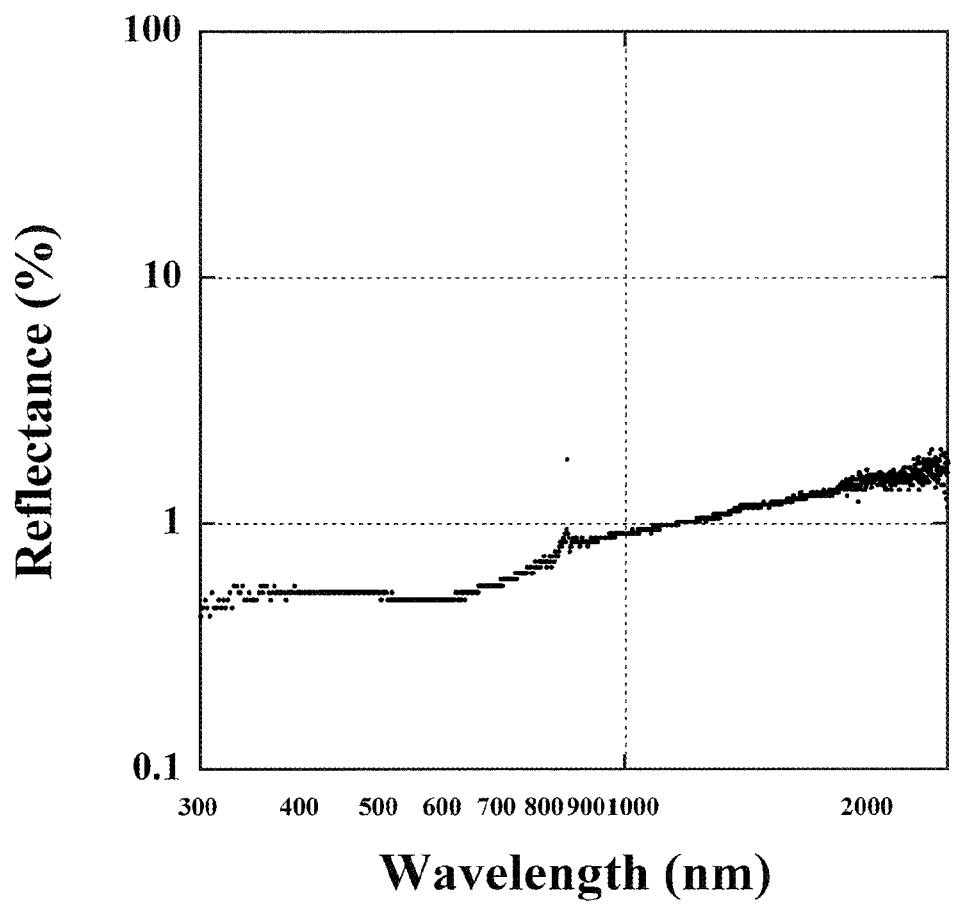
FIG. 26 is a graph showing the reflectance spectrum of the graphite compound whose surface is provided with a structure of microscopic asperities according to the present embodiment.
Figure 27:
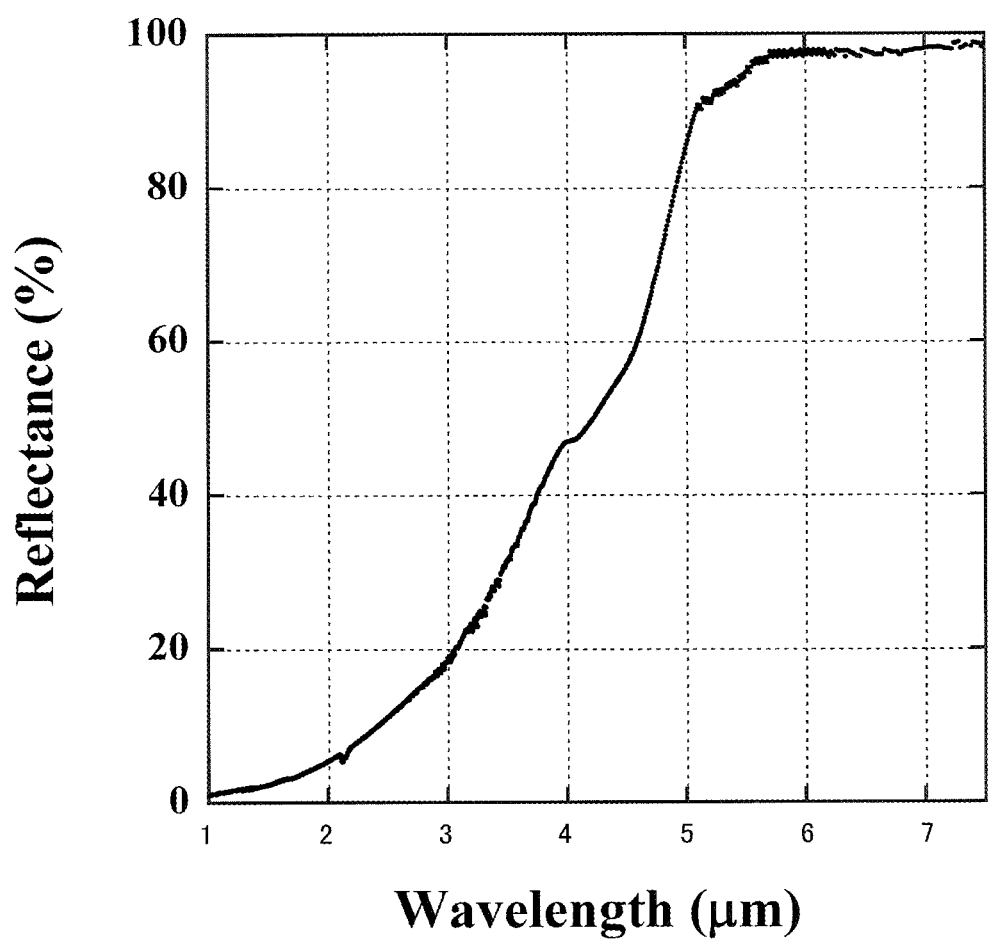
FIG. 27 is a graph showing the wide range of reflectance spectrum of the graphite compound whose surface is provided with a structure of microscopic asperities according to the present embodiment.

It is to be noted here that in the aforementioned measurement of the reflectance spectrum as shown in FIG. 26 and FIG. 27, as for the region from 0.3 to 2 μm, a spectrophotometer was used, having an integrating sphere whose inner surface was coated with $BaSO_4$ particles or the like, for collecting the entire surface reflected light. As for the reflection measurement in the region from 1 to 15 μm, an FTIR (Fourier transform infrared spectrometer) was used, having an integrating sphere whose inner surface was coated with gold for collecting the entire infrared reflected light.

Other Examples of the Infrared Radiation Material

Any material layer may be applicable as the infrared radiation material layer 21, as far as it has the predetermined stepwise reflectance property, and it is not limited to the material layer as described in the aforementioned first to third examples. By way of example, materials described in the following (a) to (d) may be usable.

(a) Structure forming a chromium film on a nickel substrate via a predetermined method such as electroplating (e.g., see G. Zajac, et al. J. Appl. Phys. 51, 5544 (1980))
(b) Alumina oxide having a porous nanometer structure on the surface, obtained by anodizing aluminum. It is possible to control the reflectance by controlling aperture, hole length, and the like (e.g., see A. Anderson, et al. J. Appl. Phys. 51, 754 (1980))
(c) Structure forming $Cr_2O_3$ layer as the antireflection coating on the cermet film made of Cr and $Cr_2O_3$ (e.g., J. C. C. Fan and S. A. Spura, Appl. Phys. ett. 30, 511 (1977))
(d) Structure having a microcavity structure being prepared on the surface of W, thereby controlling the reflectance (e.g., F. Kusunoki et al., Jpn. J. Appl. Phys. 43, 8A, 5253 (2004))
(e) Structure forming a nitride film and/or an oxide film on a metallic base material, thereby controlling the reflectance (e.g., C. E. Kennedy, NREL/TP-520-31267)

EXPLANATION OF REFERENCES

1 . . . vacuum vessel, 2 . . . heat-light conversion element, 3 . . . semiconductor power generation cell, 4 . . . window, 5 . . . lens, 6 . . . getter, 7 . . . reflection coating, 101 . . . vacuum vessel, 102 . . . heat-light conversion element

What is claimed is:
1. A power generator comprising;
a heat-light conversion element for converting heat to infrared light and,
a semiconductor power generation cell for converting the infrared light to electrical energy, wherein,
the heat-light conversion element includes a material in which a reflectance is higher on a long wavelength side of a predetermined infrared wavelength, relative to the reflectance on a short wavelength side thereof, and the material is a graphite compound provided with a structure of asperities on a surface thereof and causes radiation of the infrared light upon heating,
the structure of asperities on the surface of the graphite compound includes a first layer of asperities on an order of micrometers and a second layer of asperities on an order of nanometers, and
the first layer is positioned on a surface of the graphite compound, and the second layer is positioned on a surface of the first layer.
2. The power generator according to claim 1, wherein, the predetermined infrared wavelength is between or equal to 1 μm and 5 μm.
3. The power generator according to claim 1, wherein, the predetermined infrared wavelength is approximately 1500 nm.

\* \* \* \* \*